US008609255B2

(12) United States Patent
Aoyama et al.

(10) Patent No.: US 8,609,255 B2
(45) Date of Patent: Dec. 17, 2013

(54) POLYESTER FILM, AND SOLAR-CELL BACK SHEET AND SOLAR-CELL USING THE SAME

(75) Inventors: Shigeru Aoyama, Shiga (JP); Atsushi Shiomi, Shiga (JP); Tomohide Masuda, Shiga (JP); Kozo Takahashi, Shiga (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 13/389,637

(22) PCT Filed: Sep. 7, 2010

(86) PCT No.: PCT/JP2010/065294
§ 371 (c)(1),
(2), (4) Date: Feb. 9, 2012

(87) PCT Pub. No.: WO2011/030745
PCT Pub. Date: Mar. 17, 2011

(65) Prior Publication Data
US 2012/0192944 A1 Aug. 2, 2012

(30) Foreign Application Priority Data

Sep. 11, 2009 (JP) ................................. 2009-210128

(51) Int. Cl.
B32B 27/06 (2006.01)
B32B 27/36 (2006.01)
B32B 7/02 (2006.01)
(52) U.S. Cl.
USPC ......................................... 428/480; 428/213
(58) Field of Classification Search
USPC .................................................. 136/251, 256
See application file for complete search history.

(56) References Cited

U.S. PATENT DOCUMENTS

2007/0237972 A1 10/2007 Kliesch et al.
2008/0311385 A1* 12/2008 Miyazaki et al. ............. 428/330

FOREIGN PATENT DOCUMENTS

| JP | 2-163155 A | 6/1990 |
| JP | 2-191638 A | 7/1990 |
| JP | 9-7423 A | 1/1997 |
| JP | 9-227767 A | 9/1997 |
| JP | 11-506487 A | 6/1999 |
| JP | 2003-41030 A | 2/2003 |
| JP | 2003-155403 A | 5/2003 |
| JP | 2006-270025 A | 10/2006 |
| JP | 2007-70430 A | 3/2007 |
| JP | 2007-276478 A | 10/2007 |
| JP | 2007-302878 A | 11/2007 |
| JP | 2009-72113 A | 4/2009 |
| JP | 2009-212432 A | 9/2009 |
| WO | 9638504 A1 | 12/1996 |

OTHER PUBLICATIONS

Giles, "Extrusion: The Definitive Processing Guide and Handbook," (2005), William Andrew Publishing, pp. 331-333.*

* cited by examiner

Primary Examiner — Ling Choi
Assistant Examiner — Catherine S Branch
(74) Attorney, Agent, or Firm — DLA Piper LLP (US)

(57) ABSTRACT

A polyester film has a laminate structure including a polyester layer (layer P1) containing a crystalline polyester and inorganic particles and a polyester layer (layer P2) containing a crystalline polyester, inorganic particles, and an antihydrolysis segment, wherein the content (Wa2) of the inorganic particles in the layer P2 is at least 10 mass % of the layer P2, the difference between the content (Wa2) (mass %) of the inorganic particles in the layer P2 and the content (Wa1) (mass %) of the inorganic particles in the layer P1, Wa2−Wa1, is 5 to 25 mass %, and the content (Wb2) of the antihydrolysis segment in the layer P2 is 0.02 to 1.5 mass % of the layer P2.

3 Claims, 1 Drawing Sheet

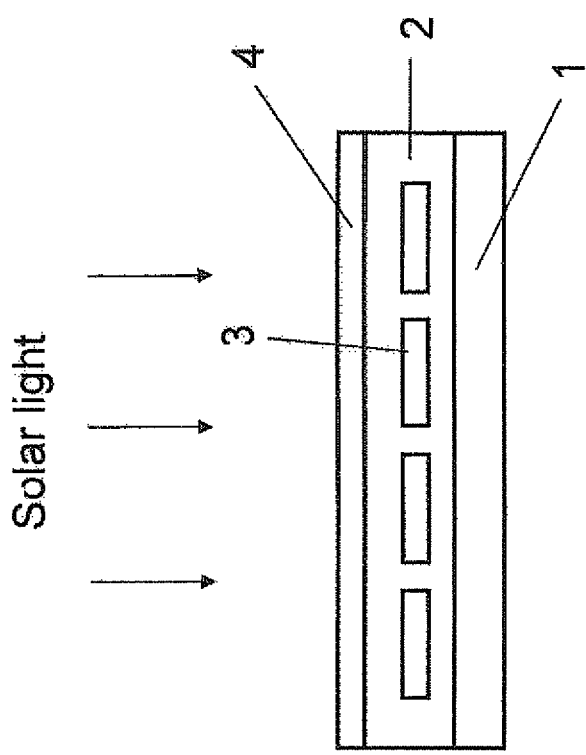

POLYESTER FILM, AND SOLAR-CELL BACK SHEET AND SOLAR-CELL USING THE SAME

RELATED APPLICATIONS

This is a §371 of International Application No. PCT/JP2010/065294, with an international filing date of Sep. 7, 2010 (WO 2011/030745, published Mar. 17, 2011), which is based on Japanese Patent Application No. 2009-210128, filed Sep. 11, 2009 (now Japanese Patent No. 4849189), the subject matter of which is incorporated herein by reference.

TECHNICAL FIELD

This disclosure relates to a polyester film which can be suitably used particularly as a solar-cell back sheet, and a solar-cell back sheet and a solar-cell, which use the film.

BACKGROUND

A polyester (particularly, polyethylene terephthalate (hereinafter, sometimes, referred to as PET), poly(ethylene-2,6-naphthalenedicarboxilate), etc.) resin is superior in mechanical properties, thermal properties, chemical resistance, electrical properties and molding properties, and is used in various applications. A polyester film prepared by forming the polyester into a film, particularly, biaxially oriented polyester film, is used as various industrial materials such as copper clad laminate plates, solar-cell back sheets, pressure-sensitive adhesive tapes, flexible printed boards, membrane switches, sheet heating elements, electrical insulation materials of a flat cable or the like, magnetic recording materials, capacitor materials, packaging materials, automobile materials, building materials, photographic applications, graphic applications and heat-sensitive transfer applications because of its mechanical properties and electrical properties.

Among these applications, in electrical insulation materials (e.g., solar-cell back sheet, etc.), automobile materials and building materials, which are used particularly outdoors, are often used under severe environments in terms of temperature and humidity for a long period. Since in a versatile polyester, its molecular weight is decreased by hydrolysis and embrittlement proceeds to cause mechanical properties to deteriorate, improvement of the polyester, that is, improvement of the moisture-heat resistance, is required. Moreover, in order to prevent the fire spread in the occurrence of a fire disaster, the flame retardancy is required.

Accordingly, various investigations have been made to suppress the hydrolysis of polyester. For example, a technique, in which an antihydrolysis segment such as epoxy-based compounds (Japanese Unexamined Patent Publication No. 9-227767 and Japanese Unexamined Patent Publication No. 2007-302878) or polycarbodiimides (Published Japanese Translation No. 11-506487 of the PCT Application, Japanese Unexamined Patent Publication No. 9-7423 and Japanese Unexamined Patent Publication No. 2003-41030) is added to improve the moisture-heat resistance of polyester, is investigated. Further, with respect to a biaxially oriented polyester film, a technique of improving the moisture-heat resistance by increasing the inherent viscosity (IV) of the film and controlling the planar orientation is investigated (Japanese Unexamined Patent Publication No. 2007-70430).

On the other hand, it is desired to impart properties other than the moisture-heat resistance (e.g., a sliding property, ultraviolet light resistance, a reflecting property, etc.) to increase performance for these applications. Thus, investigations concerning mixing other component (e.g., inorganic particle, etc.) to enhance the functions are made (e.g., Japanese Unexamined Patent Publication No. 2003-155403, Japanese Unexamined Patent Publication No. 2-163155, Japanese Unexamined Patent Publication No. 2-191638 and Japanese Unexamined Patent Publication No. 2006-270025).

However, when other components (e.g., ultraviolet absorber, inorganic particles, etc.) are mixed to enhance the function of a polyester film, particularly a polyester film containing an ethylene terephthalate unit as a main constituent, degradation of a resin proceeds due to hydrolysis in kneading, and the resulting film exhibits the function of the added component, but there is a problem that moisture-heat resistance is deteriorated.

Further, a problem that addition of the antihydrolysis segment causes the reduction of the flame retardancy arises.

Accordingly, it could be helpful to provide a polyester film which is superior in moisture-heat resistance, flame retardancy and ultraviolet light resistance.

We thus provide a polyester film having a laminate structure comprising a polyester layer (layer P1) containing a crystalline polyester and inorganic particles and a polyester layer (layer P2) containing a crystalline polyester, inorganic particles, and an antihydrolysis segment, wherein the content $Wa2$ of the inorganic particles in the layer P2 is at least 10 mass % of the layer P2, the difference between the content $Wa2$ (mass %) of the inorganic particles in the layer P2 and the content $Wa1$ (mass %) of the inorganic particles in the layer P1, $Wa2-Wa1$, is 5 to 25 mass %, and the content $Wb2$ of the antihydrolysis segment in the layer P2 is 0.02 to 1.5 mass % of the layer P2.

It is possible to provide a polyester film which satisfies moisture-heat resistance, flame retardancy, and ultraviolet light resistance over a long period. Moreover, it is possible to provide a solar-cell back sheet which uses the polyester film and, hence, has high durability; and a solar cell including the back sheet.

BRIEF DESCRIPTION OF THE DRAWING

FIG. 1 is a schematic sectional view of a solar-cell using our polyester film.

DESCRIPTION OF REFERENCE SYMBOLS

1: solar-cell back sheet
2: sealing, material
3: power generation element
4: transparent substrate The polyester film needs to be a laminated film comprising a polyester layer (layer P1) containing a crystalline polyester and inorganic particles and a polyester layer (layer P2) containing a crystalline polyester, inorganic particles, and an antihydrolysis segment. The antihydrolysis segment referred to herein refers to a compound which reacts and couples with a carboxyl terminal group of the polyester to disappear the catalytic activity of a proton originated from the carboxyl terminal group, and the detail of the antihydrolysis segment will be described later.

The polyester film requires that the content $Wa2$ of the inorganic particles in the layer P2 is at least 10 mass % of the layer P2, the difference between the content $Wa2$ (mass %) of the inorganic particles in the layer P2 and the content $Wa1$ (mass %) of the inorganic particles in the layer P1, $Wa2-Wa1$, is 5 to 25 mass %, and the content $Wb2$ of the antihydrolysis segment in the layer P2 is 0.02 to 1.5 mass % of the layer P2.

By satisfying all of the above-mentioned requirements, it is possible to provide a polyester film which satisfies moisture-heat resistance, flame retardancy, and ultraviolet light resistance at a high level over a long period.

Moreover, the polyester film can be a polyester film excellent in the curling resistance even in the case of a structure in which, of the layer P1 and the layer P2 composing the polyester film, the first layer from one surface is a layer P1 and the first layer from the other surface is a layer P2 (hereinafter, these structures are referred to as an asymmetrical structure, in addition, other layer may be composed of a plurality of layers), for example, (i) a two-layer structure consisting of layer P1/layer P2, (ii) a multilayer laminate structure of consisting of layer P1/layer P2/ . . . /layer P2, (iii) a structure consisting of layer P1/layer P2/another layer, or (iv) a structure consisting of another layer/layer P1/layer P2, layer P1/another layer/layer P2, for example, as described later. The reason for this will be described in detail below.

In a polyester, a crystalline polyester and an amorphous polyester are present, and in a common crystalline polyester, a crystalline part and an amorphous part are present. When such a crystalline polyester is stretched, a part (hereinafter, oriented crystallized part) where the polyester is pseudo-crystallized by orientation is generated in a part of the amorphous part, but all of the amorphous part are not pseudo-crystallized. Here, the amorphous part is said to have a lower density and a larger average intermolecular distance than a crystallized part or an oriented crystallized part. We investigated moisture-heat decomposition of the polyester, and found out that when a polyester film is exposed to a moisture-heat atmosphere, water content (moisture vapor) passes through between molecules in the amorphous part, which is low in a density, and permeated into the film, and plasticizes the amorphous part to increase molecular movement, that a proton originated from the carboxyl terminal group of the polyester acts as a reaction catalyst and hydrolyzes the amorphous part in which molecular movement increases, and further that if the polyester is hydrolyzed to be low in a molecular weight, molecular movement is further increased, and this progress is repeated to cause embrittlement of the film to proceed, and ultimately the film is fractured even by a slight impact.

Generally, the inorganic particles are added to the polyester to increase the function of the polyester film, and in this case, a technique of preparing a master batch containing a high level of particles once, and then diluting the master batch is used. However, since the polyester undergoes the heat history higher than its melting point in preparing the master batch, the degradation of the polyester occurs. Moreover, since the inorganic particle inherently includes adsorbed water, in the polyester containing inorganic particles, a hydrolysis reaction is accelerated. These two phenomena are combined, and consequently the moisture-heat resistance is significantly deteriorated. On the other hand, it is conceivable that to improve the moisture-heat resistance deteriorated due to such phenomena, the antihydrolysis segment is added, but if the antihydrolysis segment is added simply, the moisture-heat resistance is improved, but the flame retardancy is deteriorated because the heat resistance of the antihydrolysis segment is low.

On the other hand, in the polyester film, by containing 10 mass % or more of the inorganic particles in the layer P2, it becomes possible to impart the characteristic based on the kind of the inorganic particle to the polyester film. Further, by setting the difference between the content Wa1 of the inorganic particles in the layer P2 and the content Wa1 of the inorganic particles in the layer P1, Wa2−Wa1, within the range of 5 to 25 mass %, that is, by lowering the content of the inorganic particles in the layer P1 to a level lower than that in the layer P2, it becomes possible that the layer P1 has higher moisture-heat resistance.

Further, by setting the content of the antihydrolysis segment in the layer P2 within the range of 0.02 to 1.5 mass % of the layer P2, the moisture-heat resistance of the layer P2 can be improved without impairing the flame retardancy, and thereby, the moisture-heat resistance of the whole film can be improved.

Further, generally, when the inorganic particles are added to the crystalline polyester, the inorganic particle becomes a nucleus and the crystallinity of the polyester becomes high. Further, it is known that thereby, orientation properties at the time of stretching increase. Therefore, when the film has an asymmetrical structure comprising the layer P1 and the layer P2, in which the content of the inorganic particles are significantly different from each other, the crystallinity and the orientation properties of the layer P1 differ from those of the layer P2, and therefore the film may be largely curled with the layer containing less inorganic particles being inner side at the time of undergoing heat history during using the film. We found that it becomes possible to lower the crystallinity of the polyester layer (layer P2) when the polyester layer (layer P2) containing more inorganic particles contains the antihydrolysis segment. Thereby, we found that a polyester film having excellent curling resistance can be formed even when the polyester film has an asymmetrical structure.

Hereinafter, our films, back sheets and solar cells will be described in detail by way of specific examples.

In the polyester film, a crystalline polyester is used for the polyester layer P1 and the polyester layer P2. The crystallinity referred to here specifically refers to a resin in which a crystal melting heat $\Delta Hm$ determined from a peak area of a melt peak is 10 J/g or more in a differential scanning calory measurement chart of 2nd Run, which is obtained by heating a resin at a temperature rising rate of 20° C./min from 25° C. to 300° C. according to JIS K 7122 (1987) (1st Run), maintaining the resin for 5 minutes in this state, then quenching the resin to 25° C. or less, and heating the resin at a temperature rising rate of 20° C./min from room temperature to 300° C. again. When a resin not having the crystallinity is used, a sufficient oriented crystallized part cannot be formed even though the resin is subjected to stretching or heat treatment, and the resin becomes low in moisture-heat resistance. Further, the resin tends to result in unfavorable results in terms of the heat resistance, dimensional stability and ultraviolet light resistance of a film.

The crystallinity of the crystalline polyester is preferably higher, and the crystalline polyester having a crystal melting heat of preferably 15 J/g or more, more preferably 20 J/g or more is preferably employed. By using a resin having crystallinity, it becomes possible to better enhance oriented crystallization by stretching or heat treatment, and therefore a polyester film having excellent mechanical strength and excellent dimensional stability can be formed.

The crystalline polyester used in the polyester film is a polyester including a dicarboxylic acid constituent and a diol constituent. In addition, the term "constituent" refers to a minimum unit which can be obtained by hydrolyzing a polyester.

Examples of a dicarboxylic acid constituent constituting such a polyester include dicarboxylic acids, for example, aliphatic dicarboxylic acids such as malonic acid, succinic acid, glutaric acid, adipic acid, suberic acid, sebacic acid, dodecanedioic acid, dimer acid, eicosanedioic acid, pimelic acid, azelaic acid, methyl malonate and ethyl malonate; alicyclic dicarboxylic acids such as adamantane dicarboxylic acid, norbornene dicarboxylic acid, isosorbide, cyclohexanedicarboxylic acid and decalindicarboxylic acid; and aromatic dicarboxylic acids such as terephthalic acid, isophthalic acid, phthalic acid, 1,4-naphthalene dicarboxylic acid, 1,5-naphthalene dicarboxylic acid, 2,6-naphthalene dicarboxylic acid, 1,8-naphthalene dicarboxylic acid, 4,4'-diphenyl dicarboxylic acid, 4,4'-diphenylether dicarboxylic acid, sodium 5-sulfoisophthalate, phenyl indane dicarboxylic acid, anthracene dicarboxylic acid, phenanthrene dicarboxylic acid and 9,9'-bis(4-carboxyphenyl)fluorenic acid, and ester derivatives thereof, but the dicarboxylic acid constituent is not limited to these. Further, addition products formed by adding oxyacids such as l-lactide, d-lactide and hydroxybenzoate, and derivatives thereof, or a string of oxyacids to the terminal of the carboxyl group of the carboxylic acid constituent described above are also suitably used. These may be used singly, or may be used in combination of plural kinds as required.

Further, examples of a diol constituent constituting such a polyester include aliphatic diols such as ethylene glycol, 1,2-propanediol, 1,3-propanediol, 1,4-butanediol, 1,2-butanediol and 1,3-butanediol; alicyclic diols such as cyclohexanedimethanol, spiroglycol and isosorbide; and aromatic diols such as bisphenol A, 1,3-benzenedimethanol, 1,4-benzenedimethanol and 9,9-bis(4-hydroxyphenyl)fluorene, and a string of the above-mentioned diols, but the diol constituent is not limited to these. These may be used singly, or may be used in combination of plural kinds as required.

Further, in the polyester film, a ratio of the aromatic dicarboxylic acid constituent in the total dicarboxylic acid constituent in the polyester in the layer P1 and/or the layer P2 is preferably 90 to 100 mol %. The ratio of the aromatic dicarboxylic acid constituent is more preferably 95 to 100 mol %. The ratio of the aromatic dicarboxylic acid constituent is still more preferably 98 to 100 mol %, particularly preferably 99 to 100 mol %, and most preferably 100 mol %, that is, it is preferred that all of the dicarboxylic acid constituent is the aromatic carboxylic acid constituent. When the ratio of the aromatic dicarboxylic acid constituent is less than 90 mol %, the moisture-heat resistance and the heat resistance may be deteriorated. In the polyester film, by setting the ratio of the aromatic dicarboxylic acid constituent in the total dicarboxylic acid constituent in the polyester in the layer P1 and/or the layer P2 within the range of 90 mol % to 100 mol %, it is possible to satisfactorily combine the moisture-heat resistance and the heat resistance.

In the polyester film, as a main repeating unit composed of the dicarboxylic acid constituent and the diol constituent, which predominantly compose the polyester in the layer P1 and/or the layer P2, a unit comprising ethylene terephthalate, ethylene-2,6-naphthalenedicarboxilate, propylene terephthalate, butylene terephthalate, 1,4-cyclohexylenedimethylene terephthalate, ethylene-2,6-naphthalenedicarboxilate, or a mixture thereof is suitably employed. In addition, the main repeating unit referred to herein refers to the above-mentioned repeating unit, a total ratio of which is 70 mol % or more, more preferably 80 mol % or more, and still more preferably 90 mol % or more of all repeating units in the case of the polyester contained in the layer P1 and/or the layer P2.

Moreover, the main repeating unit is preferably ethylene terephthalate, ethylene-2,6-naphthalenedicarboxilate, and a mixture thereof in that cost is low, polymerization is easy, and the heat resistance is excellent. In this case, when ethylene terephthalate is used more as the main repeating unit, a versatile film, which is lower in cost and has moisture-heat resistance, can be prepared, and when ethylene-2,6-naphthalenedicarboxilate is used more as the main repeating unit, a film having more excellent moisture-heat resistance can be formed.

In the polyester film, the number of the carboxyl terminal groups of the polyester composing the layer P1 and/or the layer P2 is preferably 15 equivalents/t or less. The number of the terminal groups is more preferably 13 equivalents/t or less, and still more preferably 10 equivalents/t or less. When the number of the terminal groups is more than 15 equivalents/t, the catalytic activity of a proton originated from the carboxyl terminal group is high even if the antihydrolysis segment is added and, therefore, hydrolysis is accelerated and degradation proceeds, and to suppress the catalytic activity, much antihydrolysis segment has to be added. Hence, flame retardancy tends to be deteriorated. To adjust the number of the carboxyl terminal groups in the polyester layer P1 and/or the polyester layer P2 to 15 equivalents/t or less, a method 1) in which an esterification reaction between the dicarboxylic acid constituent and the dial constituent is performed, and a reactant is discharged at the time when the reactant reaches a predetermined melt viscosity through melt polymerization, formed into a strand, and cut to form chips, and then the chips are subjected to solid phase polymerization, or a method 2) in which a buffer agent is added during the time between the completion of an ester exchange reaction or an esterification reaction and the initial stage of a polycondensation reaction (inherent viscosity is less than 0.3), can be employed, and thereby a polymerized resin having the number of the carboxyl terminal groups of 20 equivalents/t or less, more preferably 18 equivalents/t or less and still more preferably 15 equivalents/t or less is formed, and then the antihydrolysis segment is added in the proportion described later.

In the polyester film, the inherent viscosity (IV) of the polyester composing the polyester layer P1 and/or the layer P2 is preferably 0.65 or more. The inherent viscosity of the polyester is more preferably 0.68 or more, still more preferably 0.7 or more, and particularly preferably 0.72 or more. When the IV is less than 0.65, the moisture-heat resistance or the mechanical properties may not be achieved because of an excessively low molecular weight of the polyester, or a thermal crystallization rate after hydrolysis may be increased and become brittle because of an excessively low entanglement between molecules. In the polyester film, by setting the inherent viscosity (IV) of the polyester composing the polyester layer P1 and/or the polyester layer P2 at 0.65 or more, high moisture-heat resistance or high mechanical properties can be achieved. In addition, an upper limit of the IV is not particularly determined, but the IV is preferably 1.0 or less, and more preferably 0.9 or less since if the IV is too high, a polymerization time is lengthened and it is economically disadvantageous, and melt extrusion becomes difficult.

In addition, to adjust the inherent viscosity of the polyester in the polyester layer P1 and/or the polyester layer P2 to 0.65 or more, by a method 1) in which the polyester is discharged at the time when the polyester reaches a predetermined melt viscosity through melt polymerization, formed into a strand and cut to form chips, or a method 2) in which the polyester is formed into chips once at an inherent viscosity lower than the target value and then the chips are subjected to solid phase polymerization, a resin having an inherent viscosity of 0.7 or more, more preferably 0.75 or more and still more preferably 0.78 or more is formed, and the resin is extruded at a temperature of a polyester melting point plus 10° C. to the melting point plus 30° C., more preferably the melting point plus 15° C. to the melting point plus 25° C. in a nitrogen atmosphere to obtain a polyester having inherent viscosity of 0.65 or more. Of these methods, as the polymerization method of a polyester, the method 2), in which the polyester is formed into chips once at an inherent viscosity lower than the target value and then the chips are subjected to solid phase polymerization, is preferable in that thermal degradation of the polyester can be suppressed and the number of the carboxyl terminal groups can be reduced.

The layer P1 and the layer P2 of the polyester film contain inorganic particles. The inorganic particle is used to impart a function required depending on its object to the film. Examples of the particles that may be suitably used include inorganic particles having an ultraviolet-absorbing power, particles having a refractive index highly different from that of the crystalline polyester, a particle having electrical conductivity, and a pigment, and thereby weatherability, optical properties, antistatic properties, and color tone can be improved. In addition, the particle refers to a particle having a volume average primary particle diameter of 5 nm or more. In addition, unless otherwise noted, a particle diameter refers to a primary particle diameter, and a particle refers to a primary particle.

Further, the particles will be described in detail. Examples of materials of the inorganic particles include metals such as gold, silver, copper, platinum, palladium, rhenium, vanadium, osmium, cobalt, iron, zinc, ruthenium, praseodymium, chromium, nickel, aluminum, tin, zinc, titanium, tantalum, zirconium, antimony, indium, yttrium, and lanthanum; metal oxides such as zinc oxide, titanium oxide, cesium oxide, antimony oxide, tin oxide, indium-tin oxide, yttrium oxide, lanthanum oxide, zirconium oxide, aluminum oxide, and silicon oxide; metal fluorides such as lithium fluoride, magnesium fluoride, aluminum fluoride, and cryolite; metal phosphates such as calcium phosphate; carbonates such as calcium carbonate; sulfates such as barium sulfate; talc and kaolin, and carbon-based compounds such as carbon, fullerene, carbon fiber and carbon nanotube.

When particles having an ultraviolet-absorbing power, for example, inorganic particles of metal oxide such as titanium oxide, zinc oxide, cerium oxide or the like, are used in view of frequent outdoor use, the positive effect of maintaining mechanical strength over a long period can be remarkably exhibited taking advantage of ultraviolet light resistance by the particles. When it is desired to provide a high reflection property, barium sulfate, calcium carbonate or the like is suitably used as inorganic particles since these are superior in an air bubble forming property through stretching.

The polyester film requires that the content $Wa2$ of the inorganic particles in the layer P2 is at least 10 mass % of the layer P2. The content $Wa2$ is more preferably 10 to 25 mass %, still more preferably 11 to 22 mass %, and particularly preferably 13 to 22 weight % of the layer P2. When the content of the particles is less than 10 weight %, the sufficient effect of the particles is not exhibited, and the ultraviolet light resistance is extremely insufficient particularly in the case of the particle having an ultraviolet-absorbing power and mechanical strength may be deteriorated when used for a long period. In addition, the content of the particles is more than 25 weight %, film forming properties may be deteriorated, or the moisture-heat resistance of the resulting film may be significantly deteriorated. Moreover, it is not preferable because curling of the film may increase when this film has an asymmetrical structure. In the polyester film, by setting the content $Wa2$ of the inorganic particles in the layer P2 within the range of 10 to 25 mass % of the layer P2, it is possible to exhibit the effect based on the addition of the particles without deteriorating the moisture-heat resistance, and moreover, it becomes possible to suppress curling when the polyester film has an asymmetrical structure.

In the polyester film, the difference between the content $Wa2$ of the inorganic particles in the layer P2 and the content $Wa1$ of the inorganic particles in the layer P1, $Wa2-Wa1$, is preferably 5 to 25 mass %. The difference between the content $Wa2$ and the content $Wa1$ is more preferably 7 to 22 mass %, and still more preferably 10 to 19 mass %. When the difference between $Wa2$ and $Wa1$ is less than 5 mass %, the effect of containing the inorganic particles may be deteriorated because of too small $Wa2$, or the moisture-heat resistance may be deteriorated because of too large $Wa1$. Further, when the difference between $Wa2$ and $Wa1$ is 25 mass % or more, the moisture-heat resistance may be deteriorated because of too large $Wa2$. Moreover, it is not preferable because curling may increase too much when this film has an asymmetrical structure. In the polyester film, by setting the difference between the content $Wa2$ of the inorganic particles in the layer P2 and the content $Wa1$ of the inorganic particles in the layer P1, $Wa2-Wa1$, within the range of 5 to 25 mass %, it is possible to exhibit the maximum effect based on containing the inorganic particles without deteriorating the moisture-heat resistance. Moreover, even when the polyester film has an asymmetrical structure, the film can be excellent in curling resistance.

In the polyester film, the content $Wa1$ of the inorganic particles in the layer P1 is preferably 0.1 to 5 mass % of the layer P1. By setting the content $Wa1$ within this range, it is possible to sufficiently exhibit the characteristic-improving effect based on the addition of the inorganic particles without deteriorating the moisture-heat resistance, and without deteriorating the adhesion even when the film has an asymmetrical structure and the surface on the layer P1 side is used as a close contact surface. The content $Wa1$ is more preferably 0.5 to 3 mass %, and still more preferably 1 to 3 mass %. When the content $Wa1$ of the inorganic particles contained in the layer P1 is less than 0.1 mass %, the sufficient effect based on containing the inorganic particles is not exhibited, and the ultraviolet light resistance is significantly insufficient particularly in the case of the particle having an ultraviolet-absorbing power and mechanical strength may be deteriorated when used for a long period. Further, it is not preferable because curling of the film may increase when the polyester film has an asymmetrical structure. Further, when the content $Wa1$ of the inorganic particles contained in the layer P1 is more than 5 mass %, it is not preferable because the moisture-heat resistance of the film may be significantly deteriorated, or the adhesion may be significantly deteriorated when the polyester film has an asymmetrical structure and the surface of the polyester layer P1 is used as an adhesive surface. In the polyester film, by setting the content $Wa1$ of the inorganic particles in the layer P1 within the range of 0.1 to 5 mass % of the layer P1, it is possible to exhibit the maximum effect based on containing the inorganic particles without deteriorating the moisture-heat resistance, and moreover, it becomes possible to satisfactorily combine the adhesion and curling even when the polyester film has an asymmetrical structure.

In the polyester film, the content $Wa$ of the inorganic particles in the whole film is preferably 1.5 to 9 mass %. The content $Wa$ of the inorganic particles is more preferably 2 to 9 mass %, and more preferably 2 to 9 mass %. Further, when the content $Wa$ is less than 1.5 mass %, the sufficient effect based on the addition of the particles may not be exhibited. Further, when $Wb$ is more than 9 mass %, the moisture-heat resistance of the film may be deteriorated. In the polyester film, by setting the content $Wa$ of the inorganic particles in the whole film within the range of 1.5 to 9 mass %, it is possible to exhibit the maximum effect based on containing the inorganic particles without deteriorating the moisture-heat resistance. An average particle of the inorganic particles used in the polyester film is preferably 0.005 to 5 μm, more preferably 0.01 to 3 μm, and particularly preferably 0.015 to 2 μm.

The antihydrolysis segment refers to a compound which reacts and couples with a carboxyl terminal group of the polyester to disappear the catalytic activity of a proton originated from the carboxyl terminal group, and specific examples of the compound include compounds having a substituent such as an oxazoline group, an epoxy group, or a carbodiimide group.

The carbodiimide compound having a carbodiimide group includes monofunctional carbodiimide and polyfunctional carbodiimide, and examples of the monofunctional carbodiimide include dicyclohexylcarbodiimide, diisopropylcarbodiimide, dimethylcarbodiimide, diisobutylcarbodiimide, dioctylcarbodiimide, tert-butylisopropylcarbodiimide, diphenylcarbodiimide, di-tert-butylcarbodiimide, and di-β-naphthylcarbodiimide. Particularly preferable monofunctional carbodiimide is dicyclohexylcarbodiimide and diisopropylcarbodiimide. As the polyfunctional carbodiimide, carbodiimides with a polymerization degree of 3 to 15 are preferable. Specific examples thereof include 1,5-naphthalene carbodiimide, 4,4'-diphenylmethane carbodiimide, 4,4'-diphenyldimethylmethane carbodiimide, 1,3-phenylene carbodiimide, 1,4-phenylene diisocyanate, 2,4-tolylene carbodiimide, 2,6-tolylene carbodiimide, a mixture composed of 2,4-tolylene carbodiimide and 2,6-tolylene carbodiimide, hexamethylene carbodiimide, cyclohexane-1,4-carbodiimide, xylylene carbodiimide, isophorone carbodiimide, isophorone carbodiimide, dicyclohexylmethane-4,4'-carbodiimide, methylcyclohexane carbodiimide, tetramethylxylylene carbodiimide, 2,6-diisopropylphenylcarbodiimide and 1,3,5-triisopropylbenzene-2,4-carbodiimide. Further, with respect to polyfunctional carbodiimide, "CARBODILITE" LA-1 produced by Nisshinbo Holdings Inc. as an aliphatic polycarbodiimide-based compound, and "Stabaxol" P100 and "Stabaxol" P400 produced by Rhein Chemie Rheinau GmbH as an aromatic polycarbodiimide-based compound are suitably used.

Since the carbodiimide compound generates an isocyanate-based gas through thermal decomposition, a highly heat-resistant carbodiimide compound is preferable. To enhance heat resistance, a carbodiimide compound having a higher molecular weight (higher polymerization degree) is preferable, and it is more preferable that a terminal of the carbodiimide compound has a highly heat-resistant structure. Further, once thermal decomposition of the carbodiimide compound occurs, further thermal decomposition tends to occur, and therefore it is necessary to device a method of preventing the thermal decomposition, for example, an extrusion temperature of the polyester is lowered as far as possible. Aromatic polycarbodiimide-based compounds are more preferable in that the moisture-heat resistance is higher, and for example, "Stabaxol" P400 produced by Rhein Chemie Rheinau GmbH is more preferably used in that the moisture-heat resistance is high.

Further, preferable examples of the epoxy-based compounds having an epoxy group include glycidyl ester compounds and glycidyl ether compounds. Specific examples of the glycidyl ester compounds include glycidyl benzoate, glycidyl t-Bu-benzoate, glycidyl p-toluate, glycidyl(cyclohexanecarboxylate), glycidyl pelargonate, glycidyl stearate, glycidyl laurate, glycidyl palmitate, glycidyl behenate, glycidyl versatate ester, glycidyl oleate, glycidyl linoleate, glycidyl linolenate, glycidyl behenolate, glycidyl stearolate, diglycidyl terephthalate, diglycidyl isophthalate, diglycidyl phthalate, diglycidyl naphthalene dicarboxylate, diglycidyl(methyl terephthalate), diglycidyl hexahydrophthalate, diglycidyl tetrahydrophthalate, diglycidyl(cyclohexane dicarboxylate), diglycidyl adipate, diglycidyl succinate, diglycidyl sebacate, diglycidyl dodecane diolate, diglycidyl(octadecane dicarboxylate), triglycidyl trimellitate and tetraglycidyl pyromellitate, and these can be used alone or in combination of two kinds or more. Specific examples of the glycidyl ether compound include phenyl glycidyl ether, o-phenyl glycidyl ether, 1,4-bis(β,γ-epoxypropoxy)butane, 1,6-bis(β,γ-epoxypropoxy)hexane, 1,4-bis(β,γ-epoxypropoxy)benzene, 1-(β,γ-epoxypropoxy)-2-ethoxyethane, 1-(β,γ-epoxypropoxy)-2-benzyl oxyethane, 2,2-bis[p-(β,γ-epoxypropoxy)phenyl] propane, and diglycidyl polyethers obtainable by reaction of bisphenols such as 2,2-bis(4-hydroxyphenyl)propane or 2,2-bis(4-hydroxyphenyl)methane and epichlorohydrin, and these can be used alone, or can be used in combination of two kinds of them or more. Further, a polyfunctional epoxy-based compound having an epoxy group in the main chain or side chain of a polymer is also suitably used, and examples thereof include "EPOFRIEND" AT501 produced by Daicel Chemical Industries, Ltd., "MODIPER" A4400 produced by Nippon Oils and Fats Co., Ltd., and "Joncryl" FA produced by BASF Corp.

Further, as the oxazoline-based compound having an oxazoline group, a bisoxazoline compound is preferable, and specific examples thereof include 2,2'-bis(2-oxazoline), 2,2'-bis(4-methyl-2-oxazoline), 2,2'-bis(4,4-dimethyl-2-oxazoline), 2,2'-bis(4-ethyl-2-oxazoline), 2,2'-bis(4,4'-diethyl-2-oxazoline), 2,2'-bis(4-propyl-2-oxazoline), 2,2'-bis(4-butyl-2-oxazoline), 2,2'-bis(4-hexyl-2-oxazoline), 2,2'-bis(4-phenyl-2-oxazoline), 2,2'-bis(4-cyclohexyl-2-oxazoline), 2,2'-bis(4-benzyl-2-oxazoline), 2,2'-p-phenylenebis(2-oxazoline), 2,2'-m-phenylenebis(2-oxazoline), 2,2'-o-phenylenebis(2-oxazoline), 2,2'-p-phenylenbbis(4-methyl-2-oxazoline), 2,2'-p-phenylenbbis(4,4-dimethyl-2-oxazoline), 2,2'-m-phenylenebis(4-methyl-2-oxazoline), 2,2'-m-phenylenebis(4,4-dimethyl-2-oxazoline), 2,2'-ethylenebis(2-oxazoline), 2,2'-tetramethylenebis(2-oxazoline), 2,2'-hexamethylenebis(2-oxazoline), 2,2'-octamethylenebis(2-oxazoline), 2,2'-decamethylenebis(2-oxazoline), 2,2'-ethylenebis(4-methyl-2-oxazoline), 2,2'-tetramethylenebis(4,4-dimethyl-2-oxazoline), 2,2'-9,9'-diphenoxyethanebis(2-oxazoline), 2,2'-cyclohexylenebis(2-oxazoline), and 2,2'-diphenylenebis(2-oxazoline). Among these, 2,2'-bis(2-oxazoline) is most preferable from the viewpoint of the reactivity with polyester. Further, examples of a polyfunctional oxazoline-based compound include a compound having a plurality of oxazoline substituents in the side chain of a polymer, and examples thereof include "Epocros" RPS-1005 produced by Nippon Shokubai Co., Ltd. Moreover, the bisoxazoline-based compound described above may be used singly, or may be used in combination of two or more species as long as it achieves our objectives.

These compounds are preferably low in volatility. Hence, they are preferably high in a molecular weight. By using a high molecular antihydrolysis segment, the volatility can be reduced. Hence, the flame retardancy of the resulting polyester film can be more enhanced. Further, the high molecular antihydrolysis segment is preferable because it can reduce the crystallinity of a polyester layer in which the crystalline polyester and the inorganic particles are mixed and therefore it has the effect of decreasing the curling of a film, for example, when this film has an asymmetrical structure.

In the polyester film, as the antihydrolysis segment, a compound having a carbodiimide group is preferable because it has a large effect of disappearing the catalytic activity of a proton originated from the carboxyl terminal group of the polyester. Moreover, a polycarbodiimide-based compound with a high polymerization degree is preferably used.

In the polyester film, the content Wb2 of the antihydrolysis segment in the polyester layer P2 needs to be 0.02 to 1.5 mass % of the layer P2. The content Wb2 of the antihydrolysis segment is more preferably 0.05 to 1 mass %, and still more preferably 0.1 to 0.8 mass % of the layer P2. When the content Wb2 is less than 0.02 mass %, the moisture-heat resistance of the layer P2 is significantly deteriorated and therefore the moisture-heat resistance of the film may be deteriorated. Further, it is not preferable because curling may significantly increase when the polyester film has an asymmetrical structure. Further, when the content Wb2 is more than 1.5 mass %, it is not preferable because the flame retardancy of the polyester film may be significantly deteriorated. In the polyester film, by setting the content Wb2 of the antihydrolysis segment in the polyester layer P2 within the range of 0.01 to 1 mass % of the layer P2, it becomes possible to satisfactorily combine the moisture-heat resistance and the flame retardancy. Further, it becomes possible to satisfactorily combine the moisture-heat resistance and the curling resistance even when the polyester film has an asymmetrical structure.

In the polyester film, the polyester layer P1 preferably further contains a antihydrolysis segment and the content Wb1 of the antihydrolysis segment in the layer P1 is preferably 0.01 to 1 mass % of the layer P1. The content Wb1 of the antihydrolysis segment is more preferably 0.02 to 0.8 mass %, and still more preferably 0.05 to 0.5 mass % of the layer P1. When the content Wb1 is less than 0.01 mass %, the moisture-heat resistance of the polyester film may be deteriorated. Further, when the content Wb1 is more than 1 mass %, the flame retardancy of the polyester film may be deteriorated. In the polyester film, by setting the content Wb1 of the antihydrolysis segment contained in the polyester layer P1 within the range of 0.01 to 1 mass % of the layer P1, it becomes possible to satisfactorily combine the moisture-heat resistance and the flame retardancy. In addition, as the antihydrolysis segment, the above-mentioned compounds can be suitably used.

In the polyester film, a ratio Wa2/Wb2 of the content Wa2 of the inorganic particles in the polyester layer P2 to the content Wb2 of the antihydrolysis segment in the polyester layer P2 is preferably 10 to 500. The ratio Wa2/Wb2 is more preferably 3 to 50, and still more preferably 10 to 30. When the ratio Wa2/Wb2 is less than 1.5, the flame retardancy of the film may be deteriorated. When the ratio Wa2/Wb2 is more than 100, the moisture-heat resistance may be deteriorated. In the polyester film, when the polyester layer P2 contains the antihydrolysis segment in such a way that the ratio Wa2/Wb2 of the content Wa2 of the inorganic particles to the content Wb2 of the antihydrolysis segment in the layer P2 is 10 to 500, it is possible to satisfactorily combine the moisture-heat resistance and the flame retardancy.

In the polyester film, a ratio Wa1/Wb1 of the content Wa1 of the inorganic particles to the content Wb1 of the antihydrolysis segment in the polyester layer P1 is preferably 1.5 to 100. The ratio Wa1/Wb1 is more preferably 3 to 50, and still more preferably 10 to 30. When the ratio Wa1/Wb1 is less than 1.5, the flame retardancy of the film may be deteriorated. When the ratio Wa1/Wb1 is more than 100, the moisture-heat resistance may be deteriorated. In the polyester film, when the polyester layer P1 contains the antihydrolysis segment such that the ratio Wa1/Wb1 of the content Wa1 of the inorganic particles to the content Wb1 of the antihydrolysis segment in the layer P1 is 1.5 to 100, it is possible to satisfactorily combine the moisture-heat resistance and the flame retardancy.

In the polyester film, the content Wb of the antihydrolysis segment in the whole film is preferably 0.01 to 1.4 mass %. The content Wb of the antihydrolysis segment is more preferably 0.02 to 1 mass %, 0.02 to 1, and still more preferably 0.05 to 0.5 mass %. When Wb is less than 0.02, the moisture-heat resistance may be deteriorated. Further, when Wb is more than 1.4 mass %, the flame retardancy of the film may be deteriorated. In the polyester film, by setting the content Wb of the antihydrolysis segment in the whole film within the range of 0.02 to 1.4 mass %, it is possible to satisfactorily combine the moisture-heat resistance and the flame retardancy.

In the polyester film, a ratio Wa/Wb of the content Wa of the inorganic particles in the whole film to the content Wb of the antihydrolysis segment in the whole film is preferably 1 to 150. The ratio Wa/Wb is more preferably 3 to 150, still more preferably 5 to 120, and particularly preferably 10 to 100. When the ratio Wa/Wb is less than 1, the flame retardancy of the film may be deteriorated. Further, when the ratio Wa/Wb is more than 150, the moisture-heat resistance may be deteriorated. In the polyester film, when the whole film contains the antihydrolysis segment in such a way that the ratio Wa/Wb of the content Wa of the inorganic particles to the content Wb of the antihydrolysis segment in the whole film is 1 to 150, it is possible to satisfactorily combine the moisture-heat resistance and the flame retardancy.

Further, to the polyester layer P1 and the polyester layer P2 of the polyester film, other additives (e.g., a heat stabilizer, an ultraviolet absorber, a weather stabilizer, an organic lubricant, a pigment, a dye, a filler, an antistatic agent, and a nucleating agent, however, the inorganic particles used herein are not included) may be blended to such an extent that the positive effect is not impaired. For example, when the ultraviolet absorber is selected as the additive, the ultraviolet light resistance of the polyester film can be enhanced. Examples of an organic ultraviolet absorber compatible with a polyester include ultraviolet absorbers such as salicylate-based, benzophenone-based, benzotriazole-based, triazine-based, cyano acrylate-based ultraviolet absorbers, and hindered amine-based ultraviolet absorbers. Specific examples of the ultraviolet absorber include salicylate-based ultraviolet absorbers such as p-t-butylphenyl salicylate, and p-octylphenyl salicylate; benzophenone-based ultraviolet absorbers such as 2,4-dihydroxybenzophenone, 2-hydroxy-4-methoxybenzophenone, 2-hydroxy-4-methoxy-5-sulfobenzophenone, 2,2',4,4'-tetrahydroxybenzophenone, and bis(2-methoxy-4-hydroxy-5-benzoylphenyl)methane; benzotriazole-based ultraviolet absorbers such as 2-(2'-hydroxy-5'-methylphenyl)benzotriazole, 2-(2'-hydroxy-5'-methylphenyl)benzotriazole, and 2,2'-methylenebis [4-(1,1, 3,3-tetramethylbutyl)-6-(2H benzotriazole-2-yl)phenol]; triazine-based ultraviolet absorbers such as 2-(4,6-diphenyl-1,3,5-triazine-2-yl)-5[(hexyl)oxy]-phenol; cyano acrylate-based ultraviolet absorbers such as ethyl-2-cyano-3,3'-diphenyl acrylate; other ultraviolet absorbers such as 2-(4,6-diphenyl-1,3,5-triazine-2-yl)-5-[(hexyl)oxy]-phenol;

hindered amine-based ultraviolet absorbers such as bis(2,2, 6,6-tetramethyl-4-piperidyl)sebacate, dimethyl succinate-1-(2-hydroxyethyl)-4-hydroxy-2,2,6,6-tetramethyl piperidine polycondensate; other ultraviolet absorbers such as nickel bis(octylphenyl)sulfide, and 2,4-di-t-butylphenyl-3',5'-di-t-butyl-4'-hydroxybenzoate.

The content of the organic ultraviolet absorber compatible with a crystalline polyester is preferably 0.1 to 10 mass %, more preferably 0.25 to 8 mass %, and still more preferably 0.5 to 5 mass % of the crystalline polyester. When the content of the organic ultraviolet absorber compatible with a polyester is less than 0.5 mass %, the ultraviolet light resistance is insufficient, and the crystalline polyester may be degraded and mechanical strength may be deteriorated when used for a long period. When the content of the organic ultraviolet absorber is more than 10% by weight, coloring of the crystalline polyester may increase.

The polyester film is composed of a laminate structure comprising the polyester layer P1 and the polyester layer P2, which respectively satisfy the above-mentioned requirements, and a structure, in which the polyester layer P1 is an inner layer and the polyester layer P2 is disposed on one side or both sides of the layer P1, is preferred. Among others, the structure, in which one outermost layer of the film is a layer P1 and the other outermost layer is a layer P2, is preferable. The reason for this is that by employing such a structure, it is possible to impart the moisture-heat resistance, the flame retardancy and the characteristic-improving effect based on containing the particles to the film at an extremely high level, and it is possible to make the high film adhesion (at the time of being bonded to other member).

A total thickness of the polyester film is preferably 10 to 300 μm, more preferably 20 to 200 μm, and most preferably 30 to 150 μm. When the thickness of the laminate is less than 10 μm, the flatness of the film may be deteriorated. When the thickness of the laminate is more than 300 μm, a total thickness of a solar-cell may become too large when the laminate is used as a solar-cell back sheet.

In the polyester film, when the layer thickness of the polyester layer P1 is denoted by T1 (μm) and the layer thickness of the polyester layer P2 is denoted by T2 (μm), a ratio T1/T2 between both thicknesses is preferably 2 to 15. The ratio T1/T2 is more preferably 4 to 10. When the ratio P1/P2 between the thickness T1 of the layer P1 and the thickness T2 of the layer P2 is less than 2, the moisture-heat resistance of the polyester film may be deteriorated. Further, curling may increase too much when the polyester film has an asymmetrical structure. Further, when the ratio T1/T2 is more than 15, the effect of improving the characteristics based on containing the inorganic particles tends to be deteriorated. In the polyester film, by setting the ratio T1/T2 within the range of 2 to 15, it is possible to exhibit the maximum effect based on containing the inorganic particles without deteriorating the moisture-heat resistance. Moreover, in the case where the polyester film has an asymmetrical structure, the film can be excellent in curling resistance.

The content Wa1 of the particles in the polyester film as a whole is preferably 1 mass % or more. The content Wa1 is more preferably 2.1 mass % or more, and still more preferably 5 mass % or more. By setting the content Wa1 within this range, it becomes possible to enhance the light-reflecting properties of the film, for example, when titanium oxide or barium sulfate is used as inorganic particles.

In the polyester film, the layer thickness T2 of the polyester layer P2 is preferably 3.5 to 15 μm. The layer thickness T2 is more preferably 5 to 12 μm, and still more preferably 6 to 10 μm. When the layer thickness T2 of the polyester layer P2 is less than 3.5 μm, the effect of improving the characteristics based on the addition of the inorganic particles tends to be deteriorated. Further, when T2 is more than 15 μm, the moisture-heat resistance may be deteriorated. Further, curling may increase too much when this film has an asymmetrical structure. In the polyester film, by setting the layer thickness T2 of the polyester layer P2 within the range of 3.5 to 15 μm, it is possible to exhibit the effect based on the addition of the particles without deteriorating the moisture-heat resistance.

Moreover, in the case where the polyester film has an asymmetrical structure, the film can be excellent in curling resistance.

The polyester film is preferably biaxially oriented. Since an oriented crystallized portion can be formed effectively by biaxial orientation, the moisture-heat resistance can be further enhanced.

In the polyester film, it is preferred that the elongation retention measured after treating for 48 hours in an atmosphere of 125° C. and a humidity of 100% RH is 50% or more. The elongation retention is more preferably 60% or more, still more preferably 70% or more, and particularly preferably 80% or more.

The elongation retention referred to herein is a value measured based on ASTM-D882-97 (see 1999 version; ANNUAL BOOK OF ASTM STANDARDS), and it can be determined from the following formula (1) when the elongation at break of the untreated film is taken as E0 and the elongation at break of the treated film is taken as E.

$$\text{Elongation retention (\%)} = E/E0 \times 100 \quad (1)$$

In addition, upon measurement, after the sample is cut out into a shape of a test piece, the sample is treated, and the treated sample is measured. By setting the elongation retention within such a range, the moisture-heat resistance of the film becomes even better, and this enables to make the moisture-heat resistance of the back sheet using the polyester film better.

Further, in the polyester film, it is preferred that the elongation retention, which is measured after irradiating for 48 hours by a metal halide lamp with an intensity of 100 mW/cm$^2$ (wavelength range: 295 to 450 nm, peak wavelength: 365 nm) in an atmosphere of 60° C. and a humidity of 50% RH, is 20% or more. The elongation retention is more preferably 25% or more, still more preferably 30% or more, and particularly preferably 40% or more. In addition, when the polyester film is irradiated by a metal halide lamp, the polyester layer (layer P2) side of the polyester film is exposed to light. Further, upon measurement, after the sample is cut out into a shape of a test piece, the sample is treated, and the treated sample is measured. By setting the elongation retention within such a range, the ultraviolet light resistance of the film can be better.

In the polyester film, it is preferred that the elongation retention measured after treating for 48 hours in an atmosphere of 125° C. and a humidity of 100% RH is 50% or more, and the elongation retention, which is measured after irradiating for 48 hours by a metal halide lamp with an intensity of 100 mW/cm$^2$ (wavelength range: 295 to 450 nm, peak wavelength: 365 nm) in an atmosphere of 60° C. and a humidity of 50% RH, is 20% or more. Since the film, which satisfies these ranges simultaneously, can be superior in moisture-heat resistance and ultraviolet light resistance, it can maintain mechanical strength over a long period in being used as a solar-cell back sheet, for example.

In the polyester film, it is preferred that curling of the film, which is heat-treated at 140° C. for 10 minutes, is 20 mm or less. The curling of the film is more preferably 15 mm or less, still more preferably 10 mm or less, and particularly preferably 5 mm or less, and the lower limit is 0 mm. When the curling of the film is more than 20 mm, processing may become difficult, for example, the film tends to contain air bubbles or the film causes position gap when the film is subjected to processing of combining with other materials (for example, bonding, coating, etc.). Further, even when the film can be processed, the resulting composite may cause curling, or curling may occur or peeling may occur during the film is used. By keeping the curling of the polyester film at 20 mm or less, the ability of the film to be processed to combine the polyester film with other materials (for example, bonding, coating, etc.) becomes better and the resulting composite can be provided with curling resistance and adhesion.

Moreover, the polyester film can form a laminate with other films. Examples of other films include a polyester layer for enhancing mechanical strength, an antistatic layer, a layer close contact with other material, an ultraviolet light resistant layer for increasing ultraviolet light resistance, a flame retardant layer for providing flame retardancy, and a hard coat layer for increasing impact resistance and abrasion resistance, and these layers may be optionally selected depending on use. Specific examples of other film at the time when the polyester film is used as a film for a solar-cell back sheet, include a good adhesive layer for improving the adhesion to another sheet material or a sealing material (e.g., ethylene vinyl acetate) in which a power generation element is embedded, an ultraviolet light resistant layer, a flame retardant layer, and a conductive layer for improving a voltage at which a partial discharge phenomenon being measure of an insulation property occurs.

In the polyester film, examples of the method of forming a laminate with other films include a method in which when each of layers to be laminated is predominantly composed of a thermoplastic resin, two different materials are charged into two separate extruder, respectively, and melted materials are co-extruded from a die onto a cooled casting drum to be formed into a sheet (co-extrusion method), and a method in which a coating material is charged into an extruder to be melt-extruded, and the melted material is laminated on a sheet formed from a monofilm while extruding the melted material from a die (melt lamination method), a method in which films are separately prepared, and these films are thermocompression bonded by a set of heated rolls (thermal lamination method), a method of bonding the films to each other through an adhesive (adhesion method), and a method of applying and drying a coating solution formed by dissolving the material in a solvent (coating method), and a mixed method thereof.

Next, an example of a method for producing the polyester film will be described. As a method for obtaining the crystalline polyester, a common polymerization method can be employed. For example, a dicarboxylic acid component such as terephthalic acid or a derivative thereof and a diol component such as ethylene glycol are subjected to an ester exchange reaction by a well-known method. Here, it is more preferable to use a component obtained by esterifying a carboxyl group for the dicarboxylic acid component or other copolymer component having a carboxylic acid group since the number of the terminal groups of the carboxyl group can be reduced and the moisture-heat resistance can be more enhanced.

Examples of a reaction catalyst include alkali metal compounds, alkaline earth metal compounds, zinc compounds, lead compounds, manganese compounds, cobalt compounds, aluminium compounds, antimony compounds, and titanium compounds which are conventionally known. It is preferable that an antimony compound or a germanium compound, a titanium compound and a buffer agent are added as polymerization catalysts at any stage prior to the completion of polycondensation of the polyester. For such a method, in the case of adding, for example, a germanium compound, it is preferable to add germanium compound powders as they are. When an antimony compound and/or a germanium compound are/is as the polymerization catalyst, it is preferable from the viewpoint of polycondensation reactivity or solid phase polymerization reactivity that the concentration thereof is 50 to 300 ppm as an antimony element or germanium element, and further it is preferable from the viewpoint of heat resistance or moisture-heat resistance that the concentration is 50 to 200 ppm. When the concentration is more than 300 ppm, the polycondensation reactivity and the solid phase polymerization reactivity are increased, but the carboxyl terminal group may increase since a decomposition reaction in re-melting is also accelerated, this may causes deterioration of the heat resistance or the moisture-heat resistance. Examples of antimony compounds and germanium compounds preferably used include antimony pentoxide, antimony trioxide, and germanium dioxide, and these can be selectively used depending on the object. For example, a polymerization catalyst by which the color tone is best is the germanium compound, a polymerization catalyst by which the solid phase polymerization reactivity is better is the antimony compound, and when the polyester film is produced by use of non-antimony catalyst in consideration of environment, the titanium catalyst is preferable because reactivity of a polycondensation reaction or solid phase polymerization is high.

When a titanium compound is used as the polycondensation catalyst, it is preferable from the viewpoint of polycondensation reactivity or solid phase polymerization reactivity that the concentration thereof is 0.1 to 20 ppm as a titanium element. When the concentration is more than 20 ppm, the polycondensation reactivity and the solid phase polymerization reactivity are increased, but this may cause deterioration of the heat resistance, the moisture-heat resistance, or color tone. Examples of the titanium catalysts used as the polycondensation catalyst include alkoxides such as tetrabutoxy titanate and tetraisopropyl titanate, and titanium chelate compounds between titanium and lactic acid or citric acid, and it is preferable from the viewpoint of heat resistance, moisture-heat resistance and color tone that the polycondensation catalyst is particularly the titanium chelate compound.

Further, as a technique of reducing the number of the carboxyl terminal groups of the polyester obtained by polymerization, a trace of alkali metal compound such as potassium hydroxide can be added during the time between the initial stage and an intermediate stage of the esterification reaction, or between before the start and the initial stage of the ester exchange reaction, or a trace of magnesium compound, for example, magnesium acetate, can be added between the completion of the esterification reaction and the initial stage of the polycondensation reaction, or before the start of the ester exchange reaction to improve electrostatic charging properties.

Further, to reduce the number of the carboxyl terminal groups of the polyester obtained by polycondensation in the range of 20 equivalents/t or less and to increase the inherent viscosity of the polyester, it is preferable that after the above polymerization is performed, the polyester is heated at a temperature of 190° C. or higher and less than a melting point of the polyester in a reduced pressure or in a stream of an inert gas such as a nitrogen gas, that is, solid phase polymerization is performed. In this case, it is preferable that as a first step, a polyester with an inherent viscosity of 0.5 to 0.6 is polymerized by the above-mentioned method, and then as a second step, the polyester is heated at a temperature of 190° C. or higher and less than a melting point of the polyester in a reduced pressure or in a stream of an inert gas such as a nitrogen gas to perform solid phase polymerization. When the inherent viscosity of the polyester is 0.5 or less, the chip is easily split and its configuration is irregular, and therefore irregular polymerization may occur in the solid phase polymerization. When the inherent viscosity of the polyester is more than 0.9, it is not preferable because thermal degradation at the first step is severe, and therefore the number of the carboxyl terminal groups of the resulting polyester increases, and hydrolysis resistance may be deteriorated in forming a film. In polymerization of a polyester used in the polyester film, by adjusting the inherent viscosity at the first step within the range of 0.5 to 0.6, the inherent viscosity can be uniformly increased in a state in which the number of the carboxyl terminal groups is kept low in performing the solid phase polymerization. As a result of this, the hydrolysis resistance can be more enhanced in forming a film.

Further, a method of adding the inorganic particles to the polyester composing the layer P1 and/or the layer P2 is preferably a method in which the crystalline polyester and the inorganic particles are previously melt-kneaded by use of a vent type twin screw kneading extruder or a tandem type extruder to form a high level of master pellet and the master pellet is added as the inorganic particles.

Further, when the polyester composing the layer P1 and/or the layer P2 contains the antihydrolysis segment, any of a method of mixing the polyester and the antihydrolysis segment at the time of forming a film, and a method, in which a master pellet of a polyester containing a high level of the antihydrolysis segment is prepared in advance and the master pellet is diluted with a polyester, is preferably employed. Preferable examples of preparing a high level of master pellet include a method in which the antihydrolysis segment is mixed with the polyester pellet and the resulting mixture is melt-kneaded using a vent type twin screw kneading extruder heated to temperatures of 265° C. to 275° C., preferably 270° C. to 275° C. to form a high level of master. The inherent viscosity of the polyester used at this time is preferably 0.7 to 1.6. The inherent viscosity is more preferably 0.75 to 1.4. The inherent viscosity IV is still more preferably 0.8 to 1.3. When the IV is less than 0.7, since the amount of the carboxyl terminal of the polyester to be kneaded with the antihydrolysis segment increases, a reaction with the antihydrolysis segment takes place too much at the time of forming a master. Therefore, the reaction between the antihydrolysis segment and the polyester, which is a diluent of the antihydrolysis segment, hardly occurs in extruding a raw material when a film is formed, and hence the amount of the carboxyl terminal in the layer P1 and/or the layer P2 cannot be reduced and the moisture-heat resistance may be deteriorated. When the IV is larger than 1.6, since the melt viscosity is too high, extrusion is unstable and therefore preparation of the master pellet becomes difficult, and if a temperature of the extruder is elevated to lower the melt viscosity, the antihydrolysis segment is thermally decomposed, and hence the amount of the carboxyl terminal in the layer P1 and/or the layer P2 cannot be reduced and the moisture-heat resistance may be deteriorated.

Next, a method for forming a film by using the above-mentioned materials will be described.

First, a composition for the polyester layer P1 and a composition for the polyester layer P2, which are respectively prepared by mixing a polyester material, a master material containing inorganic particles and a master material containing a antihydrolysis segment, are respectively dried and then supplied, in a nitrogen flow or in a reduced pressure, to two or more extruders heated to temperatures of 265 to 280° C., more preferably 270 to 275° C., and melted. Then, a polyester layer (layer P1) and a polyester layer (layer P2) are combined into one and laminated by use of a multimanifold die, a field block, a static mixer, a pinole and the like, and a laminated layer is co-extruded from a die to a cooled casting drum to form an unstretched film. In this case, it is preferable that the film is brought into close contact with a cooling body such as a casting drum by an electrostatic force by using an electrode with shapes such as a wire-shape, a tape-shape, a needle-shape, or a knife-shape, and quenched and solidified.

The unstretched film thus formed is preferably biaxially stretched at a temperature higher than a glass transition temperature Tg of the polyester. The biaxial stretching, as described above, may be sequential biaxial stretching in which stretching in a longitudinal direction and stretching in a width direction are separately performed, or simultaneous biaxial stretching in which stretching in a longitudinal direction and stretching in a width direction are simultaneously performed.

In the sequential biaxial stretching, the film was guided to a set of rolls heated to a temperature of Tg (° C.) of the polyester or higher, Tg plus 5° C. or higher and Tg plus 15° C. or lower (more preferably, Tg plus 10° C. or lower), and stretched to a length 3 to 5 times longer in a longitudinal direction (vertical direction, or machine direction), and cooled by a set of rolls of 20 to 50° C. It is preferred that subsequently, the obtained film is guided to a tenter while both ends of the film are grasped by clips, and stretched to a length 3 to 5 times longer in a direction (width direction) perpendicular to a longitudinal direction in an atmosphere heated to a temperature of Tg plus 5° C. or higher and Tg plus 30° C. or lower (more preferably Tg plus 25° C. or lower, still more preferably Tg plus 20° C. or lower).

While a stretching magnification is 3 to 5 times in each of a longitudinal direction and a width direction for both of simultaneous biaxial stretching and sequential biaxial stretching, the polyester film is stretched in such a way that an area magnification is 12 times or more, more preferably 13 times or more, still more preferably 14 times or more, particularly preferably 15 times or more, and most preferably 16 times or more. Particularly when the area magnification is 13 times or more, it is more preferable because the moisture-heat resistance of the resulting film is more improved. When the area magnification is less than 13 times, it is not preferable because the hydrolysis resistance of the resulting biaxially stretched film may be deteriorated. Further, when the area magnification is more than 20 times, breaking tends to occur in stretching the film.

Further, to complete the crystal orientation of the obtained biaxially stretched film to impart a planar property and dimensional stability, it is preferable that the film is heat treated at a temperature less than a melting point of a crystalline polyester for 1 to 30 seconds, and uniformly cooled gradually to room temperature. Generally, when a heat treatment temperature is low, heat shrinkage of a film becomes large, and therefore the heat treatment temperature is preferably high to provide high thermal dimensional stability.

However, when the heat treatment temperature is too high, it is not preferable because an amorphous part is relaxed and molecular movement becomes active, and therefore hydrolysis may easily occur, or thermal crystallization after the hydrolysis may be accelerated in an atmosphere of moisture-heat and embrittlement may easily proceed. Accordingly, it is preferable to set the heat treatment temperature in such a way that a value obtained by subtracting the heat treatment temperature from a melting point of the crystalline polyester is 40 to 90° C., more preferably 50 to 80° C., and still more preferably 55 to 75° C.

In heat treatment step, the film may be subjected to relaxation treatment by 3 to 12% in a width direction or a longitudinal direction as required. Subsequently, as required, the film is subjected to corona discharge to enhance the adhesion to other material and wound up, and thereby the polyester film can be obtained.

Further, when another film is laminated on the polyester film, in addition to the above-mentioned co-extrusion method, a method in which another thermoplastic resin is melt-extruded, and the melted resin is laminated on the prepared film while extruding the melted resin from a die (melt lamination method), a method in which the polyester film and a film made of another resin are thermocompression bonded (thermal lamination method), a method in which the polyester film and a film made of another resin are bonded to each other through an adhesive (adhesion method), and a method of applying another material onto the surface of the polyester film to form a laminate (coating method), and a mixed method thereof can be employed.

Since the polyester film has moisture-heat resistance and can satisfactorily combine moisture-heat resistance and other properties such as ultraviolet light resistance and light-reflecting properties, it can be used for applications in which long-term durability is valued, and is suitably used particularly as a film for a solar-cell back sheet.

Further, to form a solar-cell back sheet by use of the polyester film, for example, the polyester film, a sealing material adhesion layer to improve the adhesion to a sealing material (e.g., ethylene-vinylene acetate copolymer (hereinafter, referred to as EVA)), an anchor layer to increase the adhesion to the sealing material adhesion layer, a moisture vapor barrier layer, an ultraviolet absorbing layer to absorb ultraviolet light, a light-reflecting layer to enhance power generation efficiency, a light absorbing layer to develop design, and an adhesion layer to bond each layer are configured, and particularly the polyester film can be suitably used as an ultraviolet absorbing layer, a light-reflecting layer and a light absorbing layer.

The polyester film in the case of using as an ultraviolet absorbing layer in the solar-cell back sheet preferably has a function of blocking light, a wavelength of which is shorter than 380 nm. Further, the polyester film in the case of being used as a light-reflecting layer can prevent the degradation of a resin of an inner layer by reflecting ultraviolet light, and can enhance power generation efficiency by reflecting light, which has not been absorbed by a solar-cell and reaches the back sheet, and backing it to a cell. Further, the polyester film in the case of being used as a light absorbing layer can prevent degradation of a resin of an inner layer by absorbing ultraviolet light or can improve design of the solar-cell.

The sealing material adhesion layer is a layer for improving the adhesion to a sealing material such as an EVA-based resin which seals a power generation element, and located at a position closest to the power generation element, and contributes to the adhesion between the back sheet and a system. Its material is not particularly limited as long as it exhibits the adhesion to the sealing material, and for example, mixtures of EVA, EVA-ethylene-methyl acrylate copolymer (EMA), ethylene-ethyl acrylate copolymer (EEA), ethylene-butyl acrylate copolymer (EBA), ethylene-methacrylic acid copolymer (EMMA), ionomer resin, polyester, urethane resin, acrylic resin, polyethylene resin, polypropylene resin and polyamide resin, are preferably used. Further, the anchor layer is preferably formed for improving the adhesion of the sealing material adhesion layer to the back sheet as required. Its material is not particularly limited as long as the adhesion to the sealing material adhesion layer is exhibited, and for example, a mixture predominantly composed of an acrylic resin and a polyester resin is preferably used.

A moisture vapor barrier layer is a layer which prevents the moisture vapor from penetrating from a back sheet side in order to prevent the degradation of a power generation element due to the moisture vapor in composing a solar-cell. This layer is formed by forming a layer of oxide such as silicon oxide or aluminum oxide or a layer of metal such as aluminum on the surface of the film by a well known method such as a vacuum deposition method or a sputtering method. It is preferable that the thickness of the layer is usually in the range of 100 to 200 Å. In this case, there is a method in which a gas barrier layer is formed directly on the polyester film and a method in which a gas barrier layer is formed on another film and this film is laminated on the surface of the polyester film, and any of these methods is preferably employed. Further, a method for laminating a metallic foil (for example, aluminum foil) on the surface of the film can also be used. It is preferable that the thickness of the metallic foil in such a case is in the range of 10 to 50 µm from the viewpoint of processability and gas barrier properties.

By combining each of the above-mentioned layers with the polyester film, the solar-cell back sheet is formed. In addition, in the solar-cell back sheet, it is not necessary that all of the above-mentioned layers have to be formed as an independent layer, and it is a preferable aspect that these layer are formed as a function-integrated layer which combines a plurality of functions. Further, when the polyester film itself has already a required function, other layers for providing various functions can be omitted. For example, there may be cases where it is possible to omit a light-reflecting layer when the polyester film has a structure comprising a layer containing a white pigment and air bubbles and has light-reflecting properties, to omit a light absorbing layer when the polyester film has a structure comprising a layer containing a light absorbing agent and has light absorbing properties, and to omit an ultraviolet absorbing layer when the polyester film has a structure comprising a layer containing an ultraviolet absorber.

Since the polyester film is more superior moisture-heat resistance than a conventional polyester film, a solar-cell back sheet including the film can have higher moisture-heat resistance and higher ultraviolet light resistance than a conventional back sheet. To make the solar-cell back sheet exhibit the effect of high moisture-heat resistance and high ultraviolet light resistance of the polyester film, it is preferred that a volume ratio of the polyester film to the whole back sheet is 5% or more. The volume ratio is more preferably 10% or more, still more preferably 15% or more, and particularly preferably 20% or more.

Further, in the solar-cell back sheet using the polyester film, it is preferred that the polyester film is disposed at an outermost position of the solar-cell back sheet.

The reason for this is that when a layer having excellent moisture-heat resistance and flame retardancy is positioned at the outermost layer, it is possible to suppress the occurrence of cracks due to the surface degradation of the back sheet and hence the moisture-heat resistance of the whole back sheet can be enhanced, and the fire spread in a disaster such as a fire can be suppressed.

Further, in the above aspect, it is preferred that at least one outermost layer of the solar-cell back sheet is a layer P2. Moreover, it is preferred that only one outermost layer of the back sheet is a layer P2 of the polyester film. By employing such a structure, it is possible to form a solar-cell back sheet in which the effect based on the addition of the particles to the layer P2 is more exhibited.

Further, in the solar-cell back sheet using the polyester film, it is preferred that the elongation retention measured after leaving standing for 48 hours in an atmosphere of 125° C. and a humidity of 100% RH is 30% or more. The elongation retention referred to herein is a value measured based on ASTM-D882-97 (see 1999 version; ANNUAL BOOK OF ASTM STANDARDS), and it can be determined from the following formula (2) when the elongation at break of the untreated solar-cell back sheet is taken as E0' and the elongation at break of the treated solar-cell back sheet is taken as E1'.

$$\text{Elongation retention (\%)}=E1'/E0'\times 100 \qquad (2)$$

In addition, upon measurement, after the sample is cut out into a shape of a test piece, the sample is treated, and the treated sample is measured. The elongation retention is more preferably 40% or more, still more preferably 50% or more, and particularly preferably 60% or more. In the solar-cell back sheet, when the elongation retention measured after leaving standing for 48 hours in an atmosphere of 125° C. and a humidity of 100% RH is less than 30%, it is not preferable because degradation due to moisture-heat increases, for example, when a solar-cell equipped with a back sheet is used for a long period, and the back sheet may be fractured if some external impact is added to the solar-cell (for example, a falling stone impinges on the solar-cell). The polyester film is preferred because it can maintain the mechanical strength of the solar-cell back sheet over a long period to form a highly durable solar-cell by adjusting the elongation retention measured after leaving standing for 48 hours in an atmosphere of 125° C. and a humidity of 100% RH to 30% or more.

Further, in the solar-cell back sheet using the polyester film, it is preferred that the elongation retention measured after leaving standing for 72 hours in an atmosphere of 125° C. and a humidity of 100% RH is 10% or more. The elongation retention is more preferably 20% or more, and still more preferably 30% or more. The solar-cell back sheet is preferred because it can more maintain the mechanical strength of the solar-cell back sheet over a long period to form a more highly durable solar-cell by adjusting the elongation retention within such a range.

Further, it is preferred that the elongation retention, which is measured after irradiating for 48 hours by a metal halide lamp with an intensity of 100 mW/cm$^2$ (wavelength range: 295 to 450 nm, peak wavelength: 365 nm) in an atmosphere of 60° C. and a humidity of 50% RH, is 20% or more. In addition, when the solar-cell back sheet using the polyester film is irradiated with ultraviolet light, the polyester layer P2 side is a surface irradiated with ultraviolet light. In addition, upon measurement, after the sample is cut out into a shape of a test piece, the sample is treated, and the treated sample is measured. The elongation retention is more preferably 20% or more, still more preferably 25% or more, particularly preferably 30% or more, and most preferably 40% or more. In the polyester film, when the elongation retention, which is measured after irradiating for 48 hours by a metal halide lamp with an intensity of 100 mW/cm$^2$ (wavelength range: 295 to 450 nm, peak wavelength: 365 nm) in an atmosphere of 60° C. and a humidity of 50% RH, is less than 30%, it is not preferable because degradation due to ultraviolet light increases, for example, when a solar-cell equipped with a back sheet is used for a long period, and the back sheet may be fractured if some external impact is added to the solar-cell (for example, a falling stone impinges on the solar-cell). The solar-cell back sheet is preferred because it can maintain the mechanical strength of the solar-cell back sheet over a long period to form a highly durable a solar-cell, when the elongation retention, which is measured after irradiating for 48 hours by a metal halide lamp with an intensity of 100 mW/cm$^2$ (wavelength range: 295 to 450 nm, peak wavelength: 365 nm) in an atmosphere of 60° C. and a humidity of 50% RH, is adjusted to 20%.

In the solar-cell back sheet using the polyester film, it is preferred that the elongation retention measured after leaving standing for 48 hours in an atmosphere of 125° C. and a humidity of 100% RH is 30% or more, and the elongation retention, which is measured after irradiating for 48 hours by a metal halide lamp with an intensity of 100 mW/cm$^2$ (wavelength range: 295 to 450 nm, peak wavelength: 365 nm) in an atmosphere of 60° C. and a humidity of 50% RH, is 20% or more. Moreover, it is preferred that the elongation retention measured after leaving standing for 48 hours in an atmosphere of 125° C. and a humidity of 100% RH is 30% or more, the elongation retention measured after leaving standing for 72 hours in an atmosphere of 125° C. and a humidity of 100% RH is 10% or more, and the elongation retention, which is measured after irradiating for 48 hours by a metal halide lamp with an intensity of 100 mW/cm$^2$ (wavelength range: 295 to 450 nm, peak wavelength: 365 nm) in an atmosphere of 60° C. and a humidity of 50% RH, is 20% or more. The solar-cell back sheet is preferred because by satisfying these requirements, it can satisfactorily combine the moisture-heat resistance and the ultraviolet light resistance and can maintain the mechanical strength of the solar-cell back sheet over a long period to form a more highly durable a solar-cell.

A thickness of the solar-cell back sheet is preferably 50 to 500 μm, and more preferably 100 to 300 μm. The thickness of the solar-cell back sheet is still more preferably 125 to 200 μm. When the thickness is less than 50 μm, it becomes difficult to secure the flatness of the back sheet. On the other hand, when the thickness is more than 500 μm, a thickness of the whole solar-cell may become too large when the back sheet is disposed in a solar-cell.

The solar-cell is characterized by using the solar-cell back sheet using the polyester film. The solar-cell back sheet using the polyester film enables enhancement of durability or to reduce its thickness compared with conventional solar-cells making use of its characteristics that the back sheet is superior in moisture-heat resistance and other functions, in particular, ultraviolet light resistance compared with conventional back sheets. An example of a structure of the solar-cell back sheet is shown in FIG. 1. The solar-cell is configured by bonding a transparent substrate 4 such as glass, and a resin sheet, referred to as a solar-cell back sheet 1, to a power generation element, to which a lead (not shown in FIG. 1) for extracting electricity is connected, and which is sealed with a transparent sealing material 2 such as an EVA-based resin, but the solar-cell is not limited to this configuration and any configuration may be employed.

The power generation element 3 converts photo energy of solar light to electric energy, and any element of crystal silicon, polycrystal silicon, microcrystal silicon, amorphus silicon, copper-indium-selenide, compound semiconductor, and dye sensitizer can be used depending on an object, or in connection of a plural cells in series or parallel depending on desired voltage or current.

Since the transparent substrate 4 having a light transmitting property is positioned at an outermost layer, transparent materials having high transmittance, high weather resistance, high antifouling property, and high mechanical strength are used. In the solar-cell, the transparent substrate 4 having a light transmitting property may be any one as long as it satisfies the above-mentioned characteristics, and examples thereof include glass, fluoro resins such as ethylene tetrafluoride-ethylene copolymer (ETFE), polyvinyl fluoride resin (PVF), poly vinylidene fluoride (PVDF), polytetrafluoroethylene (TFE), tetrafluoroethylene-hexafluoropropylene copolymer (FEP), polychlorotrifluoroethylene (CTFE), and poly vinylidene fluoride resin; olefin-based resins; acrylic resins; and mixtures thereof. When glass is used, reinforced one is more preferable. When a transparent resin substrate is used, the above-mentioned resins which are uniaxially or biaxially stretched are preferably used from the viewpoint of mechanical strength.

Further, it is preferably performed that the surfaces of these substrates are subjected to corona treatment, plasma treatment, ozone treatment, or good adhesion treatment to provide the adhesion to the EVA-based resins which are sealing materials of the power generation element.

As the sealing material 2 for sealing the power generation element, materials having high transparency, high weather resistance, high adhesion, and high heat resistance are used to cover and fix projections and depressions of the surface of the power generation element with a resin, and protect the power generation element from an external environment, and for the purpose of electrical insulation, and to bond a substrate and a back sheet having light transmitting property to the power generation element. As the sealing materials, ethylene-vinylacetate copolymer (EVA), ethylene-methylacrylate copolymer (EMA), ethylene-ethylacrylate copolymer (EEA), ethylene-methacrylate copolymer (EMAA), ionomer resin, polyvinyl butyral resin, and mixtures thereof are preferably used. Among these resins, ethylene-vinylacetate is more preferably used in that it has an excellent balance among weather resistance, adhesion, filling property, heat resistance, cold resistance, and impact resistance.

As described above, when the solar-cell back sheet using the polyester film is disposed in a solar-cell system, it is possible to form a highly durable and/or a low profile solar-cell system compared with a conventional solar-cell system. The solar-cell can be suitably used for various applications, for example, solar light power generation systems, power source of micro electronic parts without being limited to outdoor use or indoor use.

Evaluation Method of Properties

A. Inherent Viscosity IV

A resin is dissolved in 100 ml of o-chlorophenol (solution concentration C: 12 g/ml), the viscosity of the solution at 25° C. was measure by use of an Ostwald viscometer. The viscosity of a solvent is similarly measured. [η] was calculated from the following formula (3) by use of the obtained solution viscosity, solvent viscosity, and this value was taken as an inherent viscosity (IV).

$$\eta sp/C = [\eta] + K[\eta]^2 \times C \quad (3)$$

(in the above, ηsp=(solution viscosity)/(solvent viscosity)−1, K is Huggins constant (0.343).)

B. Glass Transition Temperature Tg, Melting Point Tm, Crystal Melting Heat Using a differential scanning calorimeter "Robot DSC RDC220" manufactured by SEIKO Electronic and Disk Session "SSC/5200" as a data analyzer, polyester resin samples were measured by the following procedure according to JIS K 7122 (1987).

(1) 1st Run Measurement

Five mg of a resin sample was weighed in a sample pan and heated at a temperature rising rate of 20° C./min from 25° C. to 300° C. at a temperature rising rate of 20° C./min, and maintained at the temperature for 5 minutes, and then the temperature was quenched to 25° C. or less.

(2) 2nd Run

Immediately after the completion of 1st Run measurement, the resin sample was heated at a temperature rising rate of 20° C./min from room temperature to 300° C. again.

In the obtained differential scanning calory measurement chart of 2nd Run, a glass transition temperature of polyester Tg was determined by applying a method described in "9.3 Method for measuring glass transition point" in JIS K 7121 (1987) to a step-like varying portion of glass transition (determined from an intersection of a straight line which is equally distant in a vertical axis direction from an extended line of a base line and a curve of the step-like varying portion of glass transition). A temperature of a peak top in the crystal melt peak was taken as a melting point Tm of the polyester resin. Further, a crystal melting heat was determined from a calory of a crystal melt peak based on "9 Method for measuring transition heat" in JIS K 7121 (1987).

C. Content Wa1, Wa2 of Inorganic Particle

Each of the polyester layer P1 and the polyester layer P2 was shaved out from the film, and the contents Wa1, Wa2 of inorganic particles of the shaved pieces were determined by the following method.

A mass wa (g) of the shaved piece was measured. Then, the piece was dissolved in o-chlorophenol, and a sedimentation ingredient in an insoluble fraction was fractionated by centrifugal separation. The obtained sedimentation ingredient was washed with o-chlorophenol and centrifuged. In addition, a washing operation was repeated until the centrifuged washing liquid did not become whitish by addition of acetone. A mass wa' (g) of the obtained sedimentation ingredient was measured and the content of the inorganic particles was determined from the following formula (4).

$$\text{Content of inorganic particles (mass \%)} = wa'/wa \times 100 \quad (4)$$

D. Content Wb1, Wb2 of Antihydrolysis Segment

Each of the polyester layer P1 and the polyester layer P2 was shaved out from the film, and the contents Wb1, Wb2 of the antihydrolysis segment of the shaved pieces were determined by the following method.

(i) Antihydrolysis Segment is Carbodiimide Compound

A structural identification of the antihydrolysis segment of the shaved piece was performed by pyrolysis Gas chromatography/pyrolysis Mass Spectrometry. Further, separately, a nitrogen content (μg/g) contained per gram of the shaved piece was determined by use of a trace nitrogen analyzer ND-100. Measurement was carried out 5 times, and in quantitative determination, a calibration curve prepared based on a pyridine standard solution was used. The content of the antihydrolysis segment contained in each layer was determined from a unit molecular weight and the nitrogen content of the antihydrolysis segment.

(ii) Antihydrolysis Segment is Epoxy-Based Compound, Oxazoline-Based Compound

The shaved piece was dissolved in a heavy solvent ($CDCl_3$/$HFIP-d_2$ mixed solution). An insoluble fraction was separated by centrifugal separation, and then by using the rest solution, nuclear magnetic resonance (NMR) spectral analysis was performed. The structures of the polyester and the antihydrolysis segment were identified from the obtained results, and the content of the antihydrolysis segment was determined from the peak intensity ratio and the unit molecular weight. In addition, in the structural identification, measurement was carried out in combination with solvent extraction/separation as required.

E. Layer Thickness T1, T2, Layer Thickness Ratio T1/T2

Layer thicknesses T1, T2 and a lamination ratio T1/T2 are determined by following the procedure described below. In addition, measurement was carried out at 10 different points, and the average value of 10 measurements was used for each of the thickness T1 (μm) of the polyester layer P1, the thickness T2 (μm) of the polyester layer P2, and the layer thickness ratio T1/T2.

(A1) A film is cut in a direction perpendicular to a film face without crushing a film cross-section in a thickness direction using a microtome.

(A2) Then, the cut cross-section is observed using an electron microscope and images of magnifications of 500 times are obtained. In addition, an observation location is randomly selected, but the images are taken in such a way that a vertical direction of the image is parallel to a thickness direction of the film and a horizontal direction of the image is parallel to a planar direction of the film.

(A3) The thickness T1 of the polyester layer P1 and the thickness T2 of the polyester layer P2 in the image obtained in the above (A2) are determined.

(A4) The lamination ratio T1/T2 is determined by dividing T1 by T2.

F. Measurement of Elongation at Break

A sample was cut out into a size of 1 cm×20 cm based on ASTM-D882-97 (see 1999 version; ANNUAL BOOK OF ASTM STANDARDS), and the elongation retention at the time when the film was drawn under the conditions of a chuck distance of 5 cm and a tensile speed of 300 mm/min was measured. In addition, the number of samples was 5, and the elongation at break in a longitudinal direction and that in a width direction of the film were measured, respectively, and an average of these measurements was determined.

G. Elongation Retention after Moisture-Heat Resistance Test

After the sample was cut out into a shape (1 cm×20 cm) of a test piece, the test piece was treated for 48 hours under conditions of 125° C. and a humidity of 100% RH with a pressure cooker manufactured by TABAI ESPEC Corp., and then the elongation at break was measured according to the above-mentioned paragraph F. In addition, the measurement was carried out 5 times, and the elongation at break in a machine direction and that in a transverse direction of the film were measured, respectively, and an average of these measurements was taken as the elongation at break E1. Further, the elongation at break E0 of an untreated film was also measured according to the above-mentioned paragraph F, and an elongation retention was calculated from the following formula (1) using the resulting elongations at break E1, E2.

$$\text{Elongation retention (\%)}=E1/E0\times100 \qquad (1)$$

The obtained elongation retention was rated as follows.
Elongation retention is 80% or more: SS
Elongation retention is 75% or more and less than 80%: S
Elongation retention is 70% or more and less than 75%: A
Elongation retention is 65% or more and less than 70%: B
Elongation retention is 60% or more and less than 65%: C
Elongation retention is 50% or more and less than 60%: D
Elongation retention is less than 50%: E Symbols from SS to D indicate a good state, and among these, SS is the most excellent.

With respect to the elongation at break of the back sheet, as with Elongation Retention after Moisture-Heat Resistance Test, the elongation at break of the untreated back sheet was taken as E0', and the elongation at break E1' after treating for 48 hours under conditions of 125° C. and a humidity of 100% RH was measured, and an elongation retention was calculated from the following formula (2).

$$\text{Elongation retention (\%)}=E1'/E0'\times100 \qquad (2)$$

The obtained elongation retention was rated as follows.
Elongation retention is 60% or more: SS
Elongation retention is 55% or more and less than 60%: S
Elongation retention is 50% or more and less than 55%: A
Elongation retention is 45% or more and less than 50%: B
Elongation retention is 40% or more and less than 45%: C
Elongation retention is 30% or more and less than 40%: D
Elongation retention is less than 30%: E Symbols from SS to D indicate a good state, and among these, SS is the most excellent.

H. Elongation Retention after Ultraviolet Light Resistance Test

After the sample was cut out into a shape (1 cm×20 cm) of a test piece, the test piece was irradiated for 48 hours under conditions of 60° C., a humidity of 60% RH and a illuminance of 100 mW/cm² (light source: metal halide lamp, wavelength range: 295 to 450 nm, peak wavelength: 365 nm) using EYE Super UV Tester SUV-W131 manufactured by IWASAKI ELECTRIC Co., Ltd., and then the elongation at break was measured according to the above-mentioned paragraph F. In addition, the measurement was carried out 5 times, and the elongation at break in a machine direction and that in a transverse direction of the film were measured, respectively, and an average of these measurements was taken as the elongation at break E2. Further, the elongation at break E0 of an untreated film was also measured according to the above-mentioned paragraph F, and an elongation retention was calculated from the following formula (4) using the resulting elongations at break E1, E2.

$$\text{Elongation retention (\%)}=E2/E0\times100 \qquad (4)$$

The obtained elongation retention was rated as follows.
Elongation retention is 40% or more: S
Elongation retention is 35% or more and less than 40%: A
Elongation retention is 30% or more and less than 35%: B
Elongation retention is 25% or more and less than 30%: C
Elongation retention is 20% or more and less than 25%: D
Elongation retention is less than 20%: E Symbols from S to D indicate a good state, and among these, S is the most excellent.

With respect to the elongation at break of the back sheet, as with Elongation Retention after Moisture-Heat Resistance Test, the elongation at break of the untreated back sheet was taken as E0', and the elongation at break E2' after irradiating for 48 hours under conditions of 60° C., a humidity of 60% RH and a illuminance of 100 mW/cm² (as UV light source, metal halide lamp was used) was measured, and an elongation retention was calculated from the following formula (5).

$$\text{Elongation retention (\%)}=E2'/E0'\times100 \qquad (5)$$

The obtained elongation retention was rated as follows.
Elongation retention is 40% or more: S
Elongation retention is 35% or more and less than 40%: A
Elongation retention is 30% or more and less than 35%: B
Elongation retention is 25% or more and less than 30%: C
Elongation retention is 20% or more and less than 25%: D
Elongation retention is less than 20%: E Symbols from S to D indicate a good state, and among these, S is the most excellent.

Here, the polyester layer P2 side of the polyester film was irradiated with ultraviolet light.

I. Average Relative Reflectance

A spectral reflectance in a range of 400 to 700 nm was measured at every wavelength of 10 nm using a spectrophotometer U-3410 (manufactured by Hitachi, Ltd.), and an average of the measured values was taken as an average relative reflectance. The number of samples was 5, and the average relative reflectance of each sample was measured, and an average thereof was calculated. An integrating sphere of 60 mm in diameter (model No. 130-0632) was used as a measurement unit and a spacer of the gradient angle of 10° was attached. Further, as the standard white plate, alumina oxide (model number: 210-0740) was used. Measurement was carried out from the polyester layer P2 side.
The obtained reflection factor was rated as follows.
Reflection factor is 90% or more: S
Reflection factor is 85% or more and less than 90%: A
Reflection factor is 80% or more and less than 85%: B
Reflection factor is 75% or more and less than 80%: C
Reflection factor is 60% or more and less than 75%: D
Reflection factor is less than 60%: E
Symbols from S to D indicate a good state, and among these, S is the most excellent.

J. Curling Resistance

A film was cut out into a size of 150 mm long×100 mm wide, and left standing for 10 minutes in an atmosphere of no breeze and 140° C. using a vacuum drier (LKV-122) manufactured by TABAI ESPEC Corp., and it was taken out and cooled. Lifting heights of four corners of the cooled film were measured to determine an average. In addition, measurement was carried out on each of 5 samples which were cut out with a long side being parallel to a longitudinal direction and 5 samples which were cut out with a long side being parallel to a width direction and an average of these measurements was calculated. Both sides of the film were respectively brought into contact with a base to measure a lifting height and a larger lifting height was taken as a curling height.
The obtained curling height was rated as follows.
Curling height is 2 mm or less: S
Curling height is more than 2 mm and 5 mm or less: A
Curling height is more than 5 mm and 10 mm or less: B
Curling height is more than 10 mm and 15 mm or less: C
Curling height is more than 15 mm and 20 mm or less: D
Curling height is more than 20 mm, or curling is large and therefore it is unmeasurable: E
Symbols from S to D indicate a good state, and among these, S is the most excellent.

K. Flame Retardancy

The flame retardancy was evaluated according to a UL94-VTM testing method. A film test piece or back sheet test piece having a size of 200 mm long×50 mm wide (marked line at a location 125 mm long) was wound cylindrically and attached vertically to a clamp, and a piece of cotton was placed immediately beneath the sample. A 20 mm long flame was brought into contact with the sample for 3 seconds, and a burning time and the presence or absence of ignition of cotton by a drip were observed. After extinguishing a fire, the flame was brought into contact with the sample for 3 seconds again, and a subsequent burning time and a burning distance were observed. This test was carried out on 10 samples. Each of the resulting burned test pieces was observed and measured, and flammability of a film was rated as follows.
Average burning distance is 95 mm or less: S
Average burning distance is more than 95 mm and 100 mm or less: A
Average burning distance is more than 100 mm and 105 mm or less: B
Average burning distance is more than 105 mm and 115 mm or less: C
Average burning distance is more than 115 mm and 125 mm or less: D
Average burning distance is more than 125 mm: E
Symbols from S to D indicate a good state, and among these, S is the most excellent.
Further, the flammability of a back sheet was rated as follows.
Average burning distance is 75 mm or less: S
Average burning distance is more than 75 mm and 80 mm or less: A
Average burning distance is more than 80 mm and 85 mm or less: B
Average burning distance is more than 85 mm and 95 mm or less: C
Average burning distance is more than 95 mm and 110 mm or less: D
Average burning distance is more than 110 mm: E
Symbols from S to D indicate a good state, and among these, S is the most excellent.

L. Adhesion

A back sheet was cut out into a rectangle of 15 mm wide× 12 cm long, and a base material side of the back sheet was bonded to an acrylic plate with a thickness of 2 mm having a smooth surface with a double-faced tape, and an interface of the polyester film of Examples or Comparative Examples was partially peeled and a polyester film side of Examples or Comparative Examples was hung on a load cell of a Tensilon tension tester (UTM III manufactured by TOYO SOKKI Co., Ltd.). Next, the rest layer side was gripped by a lower chuck and drawn at a peel speed of 300 mm/min in a direction of 90 degrees with respect to a planar direction of the back sheet and peeling strength F (N/15 mm) between the polyester film of the present invention and the rest layer was measured. In addition, the peeling strength was determined from an average of peeling forces T (N) in which a peeling length was 50 mm or more excluding a rising part of an SS curve.
The obtained peeling strength was rated as follows.
Peeling strength is 4 N/15 mm or more: S
Peeling strength is 3.5 N/15 mm or more and less than 4 N/15 mm: A
Peeling strength is 3 N/15 mm or more and less than 3.5 N/15 mm: B
Peeling strength is 2.5 N/15 mm or more and less than 3 N/15 mm: C
Peeling strength is 2 N/15 mm or more and less than 2.5 N/15 mm: D
Peeling strength is less than 2 N/15 mm: E
Symbols from S to D indicate a good state, and among these, S is the most excellent.

M. Flatness

A film was cut out into a size of 150 mm long×100 mm wide, and curling and deflection of the formed back sheet were observed, and lifting heights of four corners of the back sheet were measured to determine an average. In addition, measurement was carried out on each of 5 samples which were cut out with a long side being parallel to a longitudinal direction of the back sheet and 5 samples which were cut out with a long side being parallel to a width direction, and both sides of the back sheet were respectively brought into contact with a base to measure a lifting height to determine the respective averages, and a larger average lifting height was taken as a curling height.
The obtained curling height was rated as follows.
Curling height is 2 mm or less: S
Curling height is more than 2 mm and 5 mm or less: A
Curling height is more than 5 mm and 8 mm or less: B
Curling height is more than 8 mm and 11 mm or less: C
Curling height is more than 11 mm and 15 mm or less: D
Curling height is more than 15 mm, or curling is large and therefore it is unmeasurable: E
Symbols from S to D indicate a good state, and among these, S is the most excellent.

EXAMPLES

Hereinafter, our films, back sheets and solar cells will be described by way of examples, but this disclosure is not limited to these examples.

(Raw Material)

Polyester:

PET: Dimethyl terephthalate was used as an acid component and ethylene glycol was used as a diol component, and germanium oxide (polymerization catalyst) was added so as to be 300 ppm on the germanium atom equivalent basis with respect to the resulting polyester pellet, and the polycondensation reaction of the resulting mixture was performed to prepare a polyethylene terephthalate pellet having an inherent viscosity of 0.54 and the number of the carboxyl terminal groups of 13 equivalents/t. The obtained polyethylene terephthalate was dried at 160° C. for 6 hours and then crystallized. Thereafter, solid phase polymerization was performed at 220° C. for 8 hours in a reduced pressure of 0.3 Torr to obtain polyethylene terephthalate having an inherent viscosity of 0.80 and the number of the carboxyl terminal groups of 12 equivalents/t. In addition, this resin had a glass transition temperature Tg of 83° C., a melting point Tm of 255° C., and crystal melting heat of 36 µg.

Antihydrolysis Segment

Aromatic polycarbodiimide-based compound: "Stabaxol" P400 (produced by Rhein Chemie Rheinau GmbH) was used.

Epoxy-based compound: "EPOFRIEND" AT501 (produced by Daicel Chemical Industries, Ltd., oxirane oxygen concentration 1.5 wt %) was used.

Aliphatic polycarbodiimide-based compound: "CARBODILITE" LA-1 (produced by Nisshinbo Holdings Inc.) was used.

Oxazoline-based compound: "Epocros" RPS-1005 (produced by Nippon Shokubai Co., Ltd.) was used.

Reference Example 1

One hundred parts by weight of PET and 100 parts by weight of rutile type titanium oxide particles having an average particle diameter of 200 nm were melt-kneaded in a vented twin screw kneading extruder maintained at 260° C., melt-extruded and discharged into a strand, and the discharged resin was cooled by water of 25° C. and immediately cut to prepare a master batch of titanium oxide (MB-TiO2).

Reference Example 2

One hundred parts by weight of PET and 100 parts by weight of barium sulfate having an average particle diameter of 700 nm were melt-kneaded in a vented twin screw kneading extruder maintained at 260° C., melt-extruded and discharged into a strand, and the discharged resin was cooled by water of 25° C. and immediately cut to prepare a master batch of barium sulfate (MB-BaSO$_4$).

Reference Example 3

Ninety parts by mass of the PET obtained in the above-mentioned PET and 10 parts by mass of an aromatic polycarbodiimide-based compound "Stabaxol" P400 (produced by Rhein Chemie Rheinau GmbH) as an antihydrolysis segment were supplied to a vent type twin screw kneading extruder (manufactured by Japan Steel Works, Ltd., screw diameter 30 mm, screw length/screw diameter 45.5) of a co-rotating type, in which a kneading section with a kneading paddle heated to 265° C. was disposed, and the resulting mixture was melt-extruded at a screw rotational speed of 200 rpm and discharged into a strand, and the discharged resin was cooled by water of 25° C. and immediately cut to prepare a master batch of an antihydrolysis segment (MB-1).

Reference Example 4

Ninety parts by mass of the above-mentioned PET and 10 parts by mass of an epoxy-based compound "EPOFRIEND" AT501 (produced by Daicel Chemical Industries, Ltd., oxirane oxygen concentration 1.5 wt %) as an antihydrolysis segment were supplied to a vent type twin screw kneading extruder (manufactured by Japan Steel Works, Ltd., screw diameter 30 mm, screw length/screw diameter 45.5) of co-rotating type, in which a kneading section with a kneading paddle heated to 265° C. was disposed, and the resulting mixture was melt-extruded at a screw rotational speed of 200 rpm and discharged into a strand, and the discharged resin was cooled by water of 25° C. and immediately cut to prepare a material blend chip of an antihydrolysis segment (MB-2).

Reference Example 5

A raw material blend chip of an antihydrolysis segment (MB-3) was prepared in the same manner as in Reference Example 2 except for using an aliphatic polycarbodiimide-based compound "CARBODILITE" LA-1 (produced by Nisshinbo Holdings Inc.) as an antihydrolysis segment.

Reference Example 6

A raw material blend chip of an antihydrolysis segment (MB-4) was prepared in the same manner as in Reference Example 2 except for using an oxazoline-based compound "Epocros" RPS-1005 (produced by Nippon Shokubai Co., Ltd.) as an antihydrolysis segment.

Example 1

Using a main extruder and a sub-extruder, to the main extruder (uniaxial extruder), a mixture, which was prepared by mixing PET, the titanium oxide raw material (MB-TiO2) obtained in Reference Example 1 and the master batch of an antihydrolysis segment (MB-1) obtained in Reference Example 3 in such a way that the content of titanium oxide and the content of a antihydrolysis segment were the composition shown in Table 1, was vacuum-dried at 180° C. for 2 hours, and then supplied, and the resulting mixture was melt-extruded at 275° C., filtered with a 80 µm cut filter, and guided to a T-diedie. On the other hand, to the sub-extruder, a mixture, which was prepared by mixing PET, the titanium oxide material (MB-TiO2) obtained in Reference Example 1 and the master batch of an antihydrolysis segment (MB-1) obtained in Reference Example 3 such that the content of titanium oxide and the content of an antihydrolysis segment were the composition shown in Table 1, was vacuum-dried at 180° C. for 2 hours, and then supplied. Next, a polyester layer (layer P2) supplied from a sub-extruder was joined to one side of a polyester layer (layer P1) supplied from a main extruder such that the thickness proportion between the layer P1 and the layer P2 was 6:1, and two melt layers were coextruded into a laminate from a T-die die to form a laminated sheet, and the laminated sheet was brought into close contact with a drum, in which a surface temperature was maintained at 20° C., by an electrostatic charging method, cooled and solidified to obtain an unoriented (unstretched) laminated sheet.

Subsequently, the unstretched laminated sheet was preheated by a set of rolls heated to 85° C., and then stretched to a length 3.5 times longer in a longitudinal direction (vertical direction) by use of a heating roll of 90° C., and cooled by a set of rolls of 25° C. to obtain a uniaxial stretched film.

The obtained uniaxial stretched film was guided to a preheating zone of 90° C. in a tenter while both ends of the film were grasped by clips. Subsequently, the film was stretched to a length 4.1 times longer in a direction (width direction) perpendicular to a longitudinal direction in a heating zone maintained at 100° C. Moreover, subsequently, the resulting film was subjected to a heat treatment at 210° C. for 20 seconds in a heat-treating zone in the tenter and subjected to relaxation of 4% in a width direction at 150° C. Then, the film was uniformly slowly-cooled to obtain a polyester film having a thickness of 50 μm.

A layer thickness and a layer thickness ratio of the obtained film were determined, and the results thereof are shown in Table 2. Further, an average relative reflectance, mechanical properties after the moisture-heat resistance test, mechanical properties after the ultraviolet light resistance test, curling and flame retardancy of the film were evaluated. As the results of these, it was found that as shown in Table 2, this film had excellent moisture-heat resistance, ultraviolet light resistance, light-reflecting properties and flame retardancy.

Onto the surface of a layer P1 of the obtained film, an adhesive (a mixture of 90 parts by mass of "TAKERAK" (trademark) A-310 (produced by MITSUI TAKEDA CHEMICALS, INC.) and 10 parts by weight of "TAKENATE" (trademark) A3 (produced by MITSUI TAKEDA CHEMICALS, INC.)) was applied, and dried at 150° C. for 30 seconds, and then on the face of this, a biaxially stretched polyester film "Lumirror" (trademark) X10S (produced by Toray Industries, Inc.) having a thickness of 75 μm was overlaid, and both films were bonded to each other through a laminator heated to 50° C. Further, to the biaxially stretched polyester film (X10S) side of the bonded film, a gas barrier film "Barrialox" (trademark) VM-PET1031HGTS (produced by TORAY ADVANCED FILM Co., Ltd.) having a thickness of 12 μm was bonded by use of the above adhesive with a vapor deposition layer facing outward to prepare a solar-cell back sheet having a thickness of 150 μm. The flatness, adhesion, moisture-heat resistance, flame retardancy, ultraviolet light resistance, ultraviolet light resistance and light-reflecting properties of the obtained back sheet were evaluated, and consequently, it was found that as shown in Table 2, the solar-cell back sheet had good flatness, adhesion, moisture-heat resistance, flame retardancy, ultraviolet light resistance and light-reflecting properties.

Examples 2 to 22, 24 to 30, 32 to 57, 59 to 65, 67 to 80

Polyester films were obtained in the same manner as in Example 1 except for using values shown in Table 1 as the inorganic particle contents Wa1 and Wa2, the antihydrolysis segment contents Wb1 and Wb2 and the layer thickness ratios of lamination layers.

Layer thicknesses and layer thickness ratios of lamination layers of the obtained films were determined, and the results thereof are shown in Table 2. Further, average relative reflectances, mechanical properties after the moisture-heat resistance test, mechanical properties after the ultraviolet light resistance test, curling and flame retardancy of the films were evaluated. As the results of these, it was found that as shown in Table 2, these films had excellent moisture-heat resistance, ultraviolet light resistance, light-reflecting properties and flame retardancy.

Further, solar-cell back sheets were prepared in the same manner as in Example 1 by use of these films, and the flatness, adhesion, moisture-heat resistance, flame retardancy, ultraviolet light resistance, ultraviolet light resistance and light-reflecting properties of the prepared back sheets were evaluated, and consequently, it was found that as shown in Table 2, the solar-cell back sheets had good flatness, adhesion, moisture-heat resistance, flame retardancy, ultraviolet light resistance and light-reflecting properties.

Examples 23, 31, 58 and 66

Polyester films were obtained in the same manner as in Example 1 except for using values shown in Table 1 as the inorganic particle contents Wa1 and Wa2, the antihydrolysis segment contents Wb1 and Wb2 and the layer thickness ratios of lamination layers.

Layer thicknesses and layer thickness ratios of lamination layers of the obtained films were determined, and the results thereof are shown in Table 2. Further, average relative reflectances, mechanical properties after the moisture-heat resistance test, mechanical properties after the ultraviolet light resistance test, curling resistance and flame retardancy of the films were evaluated. As the results of these, it was found that as shown in Table 2, these films had excellent moisture-heat resistance, ultraviolet light resistance, light-reflecting properties and flame retardancy.

Further, solar-cell back sheets were prepared in the same manner as in Example 1 by use of these films, and the flatness, adhesion, moisture-heat resistance, flame retardancy, ultraviolet light resistance, ultraviolet light resistance and light-reflecting properties of the prepared back sheets were evaluated, and consequently, it was found that as shown in Table 2, the solar-cell back sheets had good flatness, moisture-heat resistance, flame retardancy, ultraviolet light resistance and light-reflecting properties despite low adhesion.

Examples 81, 84 and 85

Polyester films were obtained in the same manner as in Example 1 except for using respectively, as a master batch of the antihydrolysis segment, MB-2 obtained in Reference Example 4 for Example 81, MB-3 obtained in Reference Example 5 for Example 84, and MB-4 obtained in Reference Example 6 for Example 85, to obtain the composition shown in Table 1.

Layer thicknesses and layer thickness ratios of lamination layers of the obtained films were determined, and the results thereof are shown in Table 2. Further, average relative reflectances, mechanical properties after the moisture-heat resistance test, mechanical properties after the ultraviolet light resistance test, curling resistance and flame retardancy of the films were evaluated. As the results of these, it was found that as shown in Table 2, these films had excellent moisture-heat resistance, ultraviolet light resistance, light-reflecting properties and flame retardancy.

Further, solar-cell back sheets were prepared in the same manner as in Example 1 by use of these films, and the flatness, adhesion, moisture-heat resistance, flame retardancy, ultraviolet light resistance, ultraviolet light resistance and light-reflecting properties of the prepared back sheets were evaluated, and consequently, it was found that as shown in Table 2, the solar-cell back sheets had good flatness, adhesion, moisture-heat resistance, flame retardancy, ultraviolet light resistance and light-reflecting properties.

Example 82

A polyester film was obtained in the same manner as in Example 1 except for using MB-BaSO4 obtained in Reference Example 2 as a master batch of the inorganic particle to obtain the composition shown in Table 1.

A layer thickness and a layer thickness ratio of lamination layers of the obtained film were determined, and the results thereof are shown in Table 2. Further, an average relative reflectance, mechanical properties after the moisture-heat resistance test, mechanical properties after the ultraviolet light resistance test, curling resistance and flame retardancy of the film were evaluated. As the results of these, it was found that as shown in Table 2, this film had excellent moisture-heat resistance, ultraviolet light resistance, light-reflecting properties and flame retardancy.

Further, a solar-cell back sheet was prepared in the same manner as in Example 1 by use of the film, and the flatness, adhesion, moisture-heat resistance, flame retardancy, ultraviolet light resistance, ultraviolet light resistance and light-reflecting properties of the prepared back sheet were evaluated, and consequently, it was found that as shown in Table 2, the solar-cell back sheet had good flatness, adhesion, moisture-heat resistance, flame retardancy, ultraviolet light resistance and light-reflecting properties.

Example 83

A polyester film (laminated film of three layers) was obtained in the same manner as in Example 1 except for joining two polyester layers (layer P2) supplied from a sub-extruder to both sides of a polyester layer (layer P1) supplied from a main extruder, respectively, in such a way that the thickness proportion among the layer P2, the layer P1 and the layer P2 was 1:12:1.

A layer thickness and a layer thickness ratio of lamination layers of the obtained film were determined, and the results thereof are shown in Table 2. Further, an average relative reflectance, mechanical properties after the moisture-heat resistance test, mechanical properties after the ultraviolet light resistance test, curling resistance and flame retardancy of the film were evaluated. As the results of these, it was found that as shown in Table 2, this film had excellent moisture-heat resistance, ultraviolet light resistance, light-reflecting properties and flame retardancy.

Further, a solar-cell back sheet was prepared in the same manner as in Example 1 except for applying the adhesive to the side of the layer P2 by use of the film, and the flatness, adhesion, moisture-heat resistance, flame retardancy, ultraviolet light resistance, ultraviolet light resistance and light-reflecting properties of the prepared back sheet were evaluated, and consequently, it was found that as shown in Table 2, the solar-cell back sheet had good flatness, adhesion, moisture-heat resistance, flame retardancy, ultraviolet light resistance and light-reflecting properties despite low adhesion.

Comparative Examples 1, 5, 9, 13, 17 and 18

Polyester films were obtained in the same manner as in Example 1 except for using values shown in Table 1 as the inorganic particle contents Wa1 and Wa2, the antihydrolysis segment contents Wb1 and Wb2 and the layer thickness ratios of lamination layers.

Layer thicknesses and layer thickness ratios of lamination layers of the obtained films were determined, and the results thereof are shown in Table 2. Further, average relative reflectances, mechanical properties after the moisture-heat resistance test, mechanical properties after the ultraviolet light resistance test, curling resistance and flame retardancy of the films were evaluated. As the results of these, it was found that as shown in Table 2, these films had excellent moisture-heat resistance, light-reflecting properties and flame retardancy, but they had low ultraviolet light resistance in comparison with Examples.

Further, solar-cell back sheets were prepared in the same manner as in Example 1 by use of these films, and the flatness, adhesion, moisture-heat resistance, flame retardancy, ultraviolet light resistance, ultraviolet light resistance and light-reflecting properties of the prepared back sheets were evaluated, and consequently, it was found that as shown in Table 2, the solar-cell back sheets had good flatness, adhesion, moisture-heat resistance, flame retardancy and light-reflecting properties, but they had low ultraviolet light resistance.

Comparative Examples 2, 4, 6 and 8

Polyester films were obtained in the same manner as in Example 1 except for using values shown in Table 1 as the inorganic particle contents Wa1 and Wa2, the antihydrolysis segment contents Wb1 and Wb2 and the layer thickness ratios of lamination layers.

Layer thicknesses and layer thickness ratios of lamination layers of the obtained films were determined, and the results thereof are shown in Table 2. Further, average relative reflectances, mechanical properties after the moisture-heat resistance test, mechanical properties after the ultraviolet light resistance test, curling resistance and flame retardancy of the films were evaluated. As the results of these, it was found that as shown in Table 2, these films had excellent ultraviolet light resistance, light-reflecting properties and flame retardancy, but they had low flatness and low moisture-heat resistance in comparison with Examples.

Further, solar-cell back sheets were prepared in the same manner as in Example 1 by use of these films, and the flatness, adhesion, moisture-heat resistance, flame retardancy, ultraviolet light resistance, ultraviolet light resistance and light-reflecting properties of the prepared back sheets were evaluated, and consequently, it was found that as shown in Table 2, the solar-cell back sheets had good flatness, adhesion, flame retardancy, ultraviolet light resistance and light-reflecting properties, but they had low moisture-heat resistance.

Comparative Examples 3, 7, 11 and 15

Polyester films were obtained in the same manner as in Example 1 except for using values shown in Table 1 as the inorganic particle contents Wa1 and Wa2, the antihydrolysis segment contents Wb1 and Wb2 and the layer thickness ratios of lamination layers.

Layer thicknesses and layer thickness ratios of lamination layers of the obtained films were determined, and the results thereof are shown in Table 2. Further, average relative reflectances, mechanical properties after the moisture-heat resistance test, mechanical properties after the ultraviolet light resistance test, curling resistance and flame retardancy of the films were evaluated. As the results of these, it was found that as shown in Table 2, these films had excellent moisture-heat resistance, ultraviolet light resistance, light-reflecting properties and flame retardancy, but they had low curling resistance in comparison with Examples.

Further, solar-cell back sheets were prepared in the same manner as in Example 1 by use of these films, and the flatness, adhesion, moisture-heat resistance, flame retardancy, ultraviolet light resistance, ultraviolet light resistance and light-reflecting properties of the prepared back sheets were evaluated, and consequently, it was found that as shown in Table 2, the solar-cell back sheets had good adhesion, moisture-heat resistance, ultraviolet light resistance, light-reflecting properties and flame retardancy, but they had low flatness.

Comparative Examples 10, 12, 14 and 16

Polyester films were obtained in the same manner as in Example 1 except for using values shown in Table 1 as the inorganic particle contents Wa1 and Wa2, the antihydrolysis segment contents Wb1 and Wb2 and the layer thickness ratios of lamination layers.

Layer thicknesses and layer thickness ratios of lamination layers of the obtained films were determined, and the results thereof are shown in Table 2. Further, average relative reflectances, mechanical properties after the moisture-heat resistance test, mechanical properties after the ultraviolet light resistance test, curling and flame retardancy of the films were evaluated. As the results of these, it was found that as shown in Table 2, these films had excellent moisture-heat resistance, ultraviolet light resistance, light-reflecting properties and flame retardancy, but they had low flame retardancy in comparison with Examples.

Further, solar-cell back sheets were prepared in the same manner as in Example 1 by use of these films, and the flatness, adhesion, moisture-heat resistance, flame retardancy, ultraviolet light resistance, ultraviolet light resistance and light-reflecting properties of the prepared back sheets were evaluated, and consequently, it was found that as shown in Table 2, the solar-cell back sheets had good adhesion, moisture-heat resistance, ultraviolet light resistance, light-reflecting properties and flatness, but they had low flame retardancy.

TABLE 1-1

| | Composition | | | | | layer thickness of laminate | | | |
|---|---|---|---|---|---|---|---|---|---|
| | Layer P1 Inorganic particle | Layer P2 Inorganic particle | layer P2 Antihydrolysis agent | | layer P1 Antihydrolysis agent | | | | |
| | Wa1 (mass %) | Wa2 (mass %) | Wb2 (mass %) | Wa2 − Wa1 (mass %) | Wb1 (mass %) | P1 (μm) | P2 (μm) | T1/T2 (—) | Wa (mass %) |
| Example 1 | 1 | 13 | 0.1 | 12 | 0.1 | 42.9 | 7.1 | 6.0 | 2.7 |
| Example 2 | 0.8 | 13 | 0.1 | 12.2 | 0.1 | 42.9 | 7.1 | 6.0 | 2.5 |
| Example 3 | 0.5 | 13 | 0.1 | 12.5 | 0.1 | 42.9 | 7.1 | 6.0 | 2.3 |
| Example 4 | 0.1 | 13 | 0.1 | 12.9 | 0.1 | 42.9 | 7.1 | 6.0 | 1.9 |
| Example 5 | 0 | 13 | 0.1 | 13 | 0.1 | 42.9 | 7.1 | 6.0 | 1.8 |
| Example 6 | 1 | 10 | 0.1 | 9 | 0.1 | 42.9 | 7.1 | 6.0 | 2.3 |
| Comparative Example 1 | 1 | 8 | 0.1 | 7 | 0.1 | 42.9 | 7.1 | 6.0 | 2.0 |
| Example 7 | 1 | 13 | 0.08 | 12 | 0.1 | 42.9 | 7.1 | 6.0 | 2.7 |
| Example 8 | 1 | 13 | 0.05 | 12 | 0.1 | 42.9 | 7.1 | 6.0 | 2.7 |
| Example 9 | 1 | 13 | 0.02 | 12 | 0.1 | 42.9 | 7.1 | 6.0 | 2.7 |
| Comparative Example 2 | 1 | 13 | 0.01 | 12 | 0.1 | 42.9 | 7.1 | 6.0 | 2.7 |
| Example 10 | 1 | 20 | 0.1 | 19 | 0.1 | 42.9 | 7.1 | 6.0 | 3.7 |
| Example 11 | 0.8 | 20 | 0.1 | 19.2 | 0.1 | 42.9 | 7.1 | 6.0 | 3.5 |
| Example 12 | 0.5 | 20 | 0.1 | 19.5 | 0.1 | 42.9 | 7.1 | 6.0 | 3.3 |
| Example 13 | 0.1 | 20 | 0.1 | 19.9 | 0.1 | 42.9 | 7.1 | 6.0 | 2.9 |
| Example 14 | 0 | 20 | 0.1 | 20 | 0.1 | 42.9 | 7.1 | 6.0 | 2.8 |
| Example 15 | 1 | 23 | 0.1 | 22 | 0.1 | 42.9 | 7.1 | 6.0 | 4.1 |
| Example 16 | 1 | 25 | 0.1 | 24 | 0.1 | 42.9 | 7.1 | 6.0 | 4.4 |
| Comparative Example 3 | 1 | 27 | 0.1 | 26 | 0.1 | 42.9 | 7.1 | 6.0 | 4.7 |
| Example 17 | 1 | 20 | 0.08 | 19 | 0.1 | 42.9 | 7.1 | 6.0 | 3.7 |
| Example 18 | 1 | 20 | 0.05 | 19 | 0.1 | 42.9 | 7.1 | 6.0 | 3.7 |
| Example 19 | 1 | 20 | 0.02 | 19 | 0.1 | 42.9 | 7.1 | 6.0 | 3.7 |
| Comparative Example 4 | 1 | 20 | 0.01 | 19 | 0.1 | 42.9 | 7.1 | 6.0 | 3.7 |
| Example 20 | 3 | 13 | 0.1 | 10 | 0.1 | 42.9 | 7.1 | 6.0 | 4.4 |
| Example 21 | 4 | 13 | 0.1 | 9 | 0.1 | 42.9 | 7.1 | 6.0 | 5.3 |
| Example 22 | 5 | 13 | 0.1 | 8 | 0.1 | 42.9 | 7.1 | 6.0 | 6.1 |
| Example 23 | 6 | 13 | 0.1 | 7 | 0.1 | 42.9 | 7.1 | 6.0 | 7.0 |
| Example 24 | 3 | 10 | 0.1 | 7 | 0.1 | 42.9 | 7.1 | 6.0 | 4.0 |
| Comparative Example 5 | 3 | 8 | 0.1 | 5 | 0.1 | 42.9 | 7.1 | 6.0 | 3.7 |
| Example 25 | 3 | 13 | 0.08 | 10 | 0.1 | 42.9 | 7.1 | 6.0 | 4.4 |
| Example 26 | 3 | 13 | 0.05 | 10 | 0.1 | 42.9 | 7.1 | 6.0 | 4.4 |
| Example 27 | 3 | 13 | 0.02 | 10 | 0.1 | 42.9 | 7.1 | 6.0 | 4.4 |
| Comparative Example 6 | 3 | 13 | 0.01 | 10 | 0.1 | 42.9 | 7.1 | 6.0 | 4.4 |
| Example 28 | 3 | 22 | 0.1 | 19 | 0.1 | 42.9 | 7.1 | 6.0 | 5.7 |
| Example 29 | 4 | 22 | 0.1 | 18 | 0.1 | 42.9 | 7.1 | 6.0 | 6.6 |
| Example 30 | 5 | 22 | 0.1 | 17 | 0.1 | 42.9 | 7.1 | 6.0 | 7.4 |
| Example 31 | 6 | 22 | 0.1 | 16 | 0.1 | 42.9 | 7.1 | 6.0 | 8.3 |
| Example 32 | 3 | 25 | 0.1 | 22 | 0.1 | 42.9 | 7.1 | 6.0 | 6.1 |
| Comparative Example 7 | 1 | 27 | 0.1 | 26 | 0.1 | 42.9 | 7.1 | 6.0 | 4.7 |
| Example 33 | 3 | 22 | 0.08 | 19 | 0.1 | 42.9 | 7.1 | 6.0 | 5.7 |
| Example 34 | 3 | 22 | 0.05 | 19 | 0.1 | 42.9 | 7.1 | 6.0 | 5.7 |
| Example 35 | 3 | 22 | 0.02 | 19 | 0.1 | 42.9 | 7.1 | 6.0 | 5.7 |
| Comparative Example 8 | 3 | 22 | 0.01 | 19 | 0.1 | 42.9 | 7.1 | 6.0 | 5.7 |
| Example 36 | 1 | 13 | 0.8 | 12 | 0.1 | 42.9 | 7.1 | 6.0 | 2.7 |
| Example 37 | 0.8 | 13 | 0.8 | 12.2 | 0.1 | 42.9 | 7.1 | 6.0 | 2.5 |
| Example 38 | 0.5 | 13 | 0.8 | 12.5 | 0.1 | 42.9 | 7.1 | 6.0 | 2.3 |
| Example 39 | 0.1 | 13 | 0.8 | 12.9 | 0.1 | 42.9 | 7.1 | 6.0 | 1.9 |
| Example 40 | 0 | 13 | 0.8 | 13 | 0.1 | 42.9 | 7.1 | 6.0 | 1.8 |
| Example 41 | 1 | 10 | 0.8 | 9 | 0.1 | 42.9 | 7.1 | 6.0 | 2.3 |
| Comparative Example 9 | 1 | 8 | 0.8 | 7 | 0.1 | 42.9 | 7.1 | 6.0 | 2.0 |
| Example 42 | 1 | 10 | 0.9 | 9 | 0.1 | 42.9 | 7.1 | 6.0 | 2.3 |

TABLE 1-1-continued

| | Composition | | | | | layer thickness of laminate | | | |
|---|---|---|---|---|---|---|---|---|---|
| | Layer P1 Inorganic particle | Layer P2 Inorganic particle | layer P2 Antihydrolysis agent | | layer P1 Antihydrolysis agent | | | | |
| | Wa1 (mass %) | Wa2 (mass %) | Wb2 (mass %) | Wa2 − Wa1 (mass %) | Wb1 (mass %) | P1 (μm) | P2 (μm) | T1/T2 (—) | Wa (mass %) |
| Example 43 | 1 | 10 | 1 | 9 | 0.1 | 42.9 | 7.1 | 6.0 | 2.3 |
| Example 44 | 1 | 10 | 1.5 | 9 | 0.1 | 42.9 | 7.1 | 6.0 | 2.3 |
| Comparative Example 10 | 1 | 10 | 1.6 | 9 | 0.1 | 42.9 | 7.1 | 6.0 | 2.3 |
| Example 45 | 1 | 20 | 0.8 | 19 | 0.1 | 42.9 | 7.1 | 6.0 | 3.7 |
| Example 46 | 0.8 | 20 | 0.8 | 19.2 | 0.1 | 42.9 | 7.1 | 6.0 | 3.5 |
| Example 47 | 0.5 | 20 | 0.8 | 19.5 | 0.1 | 42.9 | 7.1 | 6.0 | 3.3 |
| Example 48 | 0.1 | 20 | 0.8 | 19.9 | 0.1 | 42.9 | 7.1 | 6.0 | 2.9 |
| Example 49 | 0 | 20 | 0.8 | 20 | 0.1 | 42.9 | 7.1 | 6.0 | 2.8 |
| Example 50 | 1 | 23 | 0.8 | 22 | 0.1 | 42.9 | 7.1 | 6.0 | 4.1 |
| Example 51 | 1 | 25 | 0.8 | 24 | 0.1 | 42.9 | 7.1 | 6.0 | 4.4 |
| Comparative Example 11 | 1 | 27 | 0.8 | 26 | 0.1 | 42.9 | 7.1 | 6.0 | 4.7 |
| Example 52 | 1 | 22 | 0.9 | 21 | 0.1 | 42.9 | 7.1 | 6.0 | 4.0 |
| Example 53 | 1 | 22 | 1 | 21 | 0.1 | 42.9 | 7.1 | 6.0 | 4.0 |
| Example 54 | 1 | 22 | 1.5 | 21 | 0.1 | 42.9 | 7.1 | 6.0 | 4.0 |
| Comparative Example 12 | 1 | 22 | 1.6 | 21 | 0.1 | 42.9 | 7.1 | 6.0 | 4.0 |
| Example 55 | 3 | 13 | 0.8 | 10 | 0.1 | 42.9 | 7.1 | 6.0 | 4.4 |
| Example 56 | 4 | 13 | 0.8 | 9 | 0.1 | 42.9 | 7.1 | 6.0 | 5.3 |
| Example 57 | 5 | 13 | 0.8 | 8 | 0.1 | 42.9 | 7.1 | 6.0 | 6.1 |
| Example 58 | 6 | 13 | 0.8 | 7 | 0.1 | 42.9 | 7.1 | 6.0 | 7.0 |
| Example 59 | 3 | 10 | 0.8 | 7 | 0.1 | 42.9 | 7.1 | 6.0 | 4.0 |
| Comparative Example 13 | 3 | 8 | 0.8 | 5 | 0.1 | 42.9 | 7.1 | 6.0 | 3.7 |
| Example 60 | 3 | 13 | 0.9 | 10 | 0.1 | 42.9 | 7.1 | 6.0 | 4.4 |
| Example 61 | 3 | 13 | 1 | 10 | 0.1 | 42.9 | 7.1 | 6.0 | 4.4 |
| Example 62 | 3 | 13 | 1.5 | 10 | 0.1 | 42.9 | 7.1 | 6.0 | 4.4 |
| Comparative Example 14 | 3 | 13 | 1.6 | 10 | 0.1 | 42.9 | 7.1 | 6.0 | 4.4 |
| Example 63 | 3 | 22 | 0.8 | 19 | 0.1 | 42.9 | 7.1 | 6.0 | 5.7 |
| Example 64 | 4 | 22 | 0.8 | 18 | 0.1 | 42.9 | 7.1 | 6.0 | 6.6 |
| Example 65 | 5 | 22 | 0.8 | 17 | 0.1 | 42.9 | 7.1 | 6.0 | 7.4 |
| Example 66 | 6 | 22 | 0.8 | 16 | 0.1 | 42.9 | 7.1 | 6.0 | 8.3 |
| Example 67 | 3 | 25 | 0.8 | 22 | 0.1 | 42.9 | 7.1 | 6.0 | 6.1 |
| Comparative Example 15 | 3 | 27 | 0.8 | 24 | 0.1 | 42.9 | 7.1 | 6.0 | 6.4 |
| Example 68 | 3 | 22 | 0.9 | 19 | 0.1 | 42.9 | 7.1 | 6.0 | 5.7 |
| Example 69 | 3 | 22 | 1 | 19 | 0.1 | 42.9 | 7.1 | 6.0 | 5.7 |
| Example 70 | 3 | 22 | 1.5 | 19 | 0.1 | 42.9 | 7.1 | 6.0 | 5.7 |
| Comparative Example 16 | 3 | 22 | 1.6 | 19 | 0.1 | 42.9 | 7.1 | 6.0 | 5.7 |
| Comparative Example 17 | 3 | 7 | 0.1 | 4 | 0.1 | 42.9 | 7.1 | 6.0 | 3.6 |
| Comparative Example 18 | 3 | 7 | 0.8 | 4 | 0.1 | 42.9 | 7.1 | 6.0 | 3.6 |
| Example 71 | 1.5 | 18 | 0.5 | 16.5 | 0.1 | 42.9 | 7.1 | 6.0 | 3.8 |
| Example 72 | 1.5 | 18 | 0.5 | 16.5 | 0.05 | 42.9 | 7.1 | 6.0 | 3.8 |
| Example 73 | 1.5 | 18 | 0.5 | 16.5 | 0 | 42.9 | 7.1 | 6.0 | 3.8 |
| Example 74 | 1.5 | 18 | 0.5 | 16.5 | 0.5 | 42.9 | 7.1 | 6.0 | 3.8 |
| Example 75 | 1.5 | 18 | 0.5 | 16.5 | 0.6 | 42.9 | 7.1 | 6.0 | 3.8 |
| Example 76 | 1.5 | 18 | 0.5 | 16.5 | 0.1 | 38 | 12 | 3.2 | 5.5 |
| Example 77 | 1.5 | 18 | 0.5 | 16.5 | 0.1 | 40 | 10 | 4.0 | 4.8 |
| Example 78 | 1.5 | 18 | 0.5 | 16.5 | 0.1 | 44 | 6 | 7.3 | 3.5 |
| Example 79 | 1.5 | 18 | 0.5 | 16.5 | 0.1 | 45.4 | 4.6 | 9.9 | 3.0 |
| Example 80 | 1.5 | 18 | 0.5 | 16.5 | 0.1 | 46.3 | 3.7 | 12.5 | 2.7 |
| Example 81 | 1.5 | 18 | 0.5 | 16.5 | 0.1 | 42.9 | 7.1 | 6.0 | 3.8 |
| Example 82 | 1.5 | 18 | 0.5 | 16.5 | 0.1 | 42.9 | 7.1 | 6.0 | 3.8 |
| Example 83 | 1.5 | 18 | 0.5 | 16.5 | 0.1 | 42.9 | 7.1 | 6.0 | 3.8 |
| Example 84 | 1.5 | 18 | 0.5 | 16.5 | 0.1 | 42.9 | 7.1 | 6.0 | 3.8 |
| Example 85 | 1.5 | 18 | 0.5 | 16.5 | 0.1 | 42.9 | 7.1 | 6.0 | 3.8 |

TABLE 2-1

| | Film property | | | | | Back sheet property | | | | | |
|---|---|---|---|---|---|---|---|---|---|---|---|
| | Moist-heat resistance | Flame retardancy | Curling resistance | Ultraviolet light resistance | Light-reflecting property | Flatness | Adehesion | Moist-heat resistance | Flame retardancy | Ultraviolet light resistance | Light-reflecting property |
| Example 1 | S | S | S | S | B | S | S | S | S | S | B |
| Example 2 | S | S | S | B | B | S | S | S | S | B | B |
| Example 3 | S | S | S | B | B | S | S | S | S | B | B |
| Example 4 | S | S | S | C | C | S | S | S | S | C | C |
| Example 5 | S | S | S | D | C | S | S | S | S | D | C |
| Example 6 | S | S | S | C | B | S | S | S | S | C | B |

TABLE 2-1-continued

| | Film property | | | | | Back sheet property | | | | | |
|---|---|---|---|---|---|---|---|---|---|---|---|
| | Moist-heat resistance | Flame retardancy | Curling resistance | Ultraviolet light resistance | Light-reflecting property | Flatness | Adehesion | Moist-heat resistance | Flame retardancy | Ultraviolet light resistance | Light-reflecting property |
| Comparative Example 1 | S | S | S | E | B | S | S | S | S | E | B |
| Example 7 | B | S | B | S | B | B | S | B | S | S | B |
| Example 8 | B | S | B | S | B | B | S | B | S | S | B |
| Example 9 | C | S | C | S | B | C | S | C | S | S | B |
| Comparative Example 2 | E | S | E | S | B | E | S | E | S | S | B |
| Example 10 | S | S | S | S | B | S | S | S | S | S | B |
| Example 11 | S | S | C | B | B | C | S | S | S | B | B |
| Example 12 | S | S | C | B | B | C | S | S | S | B | B |
| Example 13 | S | S | C | C | B | C | S | S | S | C | B |
| Example 14 | S | S | C | D | B | C | S | S | S | D | B |
| Example 15 | B | S | C | S | B | C | S | B | S | S | B |
| Example 16 | D | S | D | S | B | D | S | D | S | S | B |
| Comparative Example 3 | D | S | E | S | B | E | S | D | S | S | B |
| Example 17 | B | S | B | S | B | B | S | B | S | S | B |
| Example 18 | B | S | B | S | B | B | S | B | S | S | B |
| Example 19 | C | S | C | S | B | C | S | C | S | S | B |
| Comparative Example 4 | E | S | E | S | B | E | S | E | S | S | B |
| Example 20 | S | S | S | S | B | S | S | S | S | S | B |
| Example 21 | C | S | S | S | A | S | B | C | S | S | A |
| Example 22 | D | S | S | S | A | S | D | D | S | S | A |
| Example 23 | D | S | S | S | A | S | E | D | S | S | A |
| Example 24 | S | S | S | C | B | S | S | S | S | C | B |
| Comparative Example 5 | S | S | S | E | B | S | S | S | S | E | B |
| Example 25 | B | S | B | S | B | B | S | B | S | S | B |
| Example 26 | B | S | B | S | B | B | S | B | S | S | B |
| Example 27 | C | S | C | S | B | C | S | C | S | S | B |
| Comparative Example 6 | E | S | E | S | B | E | S | E | S | S | B |
| Example 28 | S | S | S | S | A | S | S | S | S | S | A |
| Example 29 | C | S | S | S | A | S | B | C | S | S | A |
| Example 30 | D | S | S | S | A | S | D | D | S | S | A |
| Example 31 | D | S | S | S | A | S | E | D | S | S | A |
| Example 32 | A | S | B | S | A | B | S | A | S | S | A |
| Comparative Example 7 | B | S | E | S | B | E | S | B | S | S | B |
| Example 33 | B | S | B | S | A | B | S | B | S | S | A |
| Example 34 | B | S | B | S | A | B | S | B | S | S | A |
| Example 35 | C | S | C | S | A | C | S | C | S | S | A |
| Comparative Example 8 | E | S | E | S | A | E | S | E | S | S | A |
| Example 36 | S | S | S | S | B | S | S | S | S | S | B |
| Example 37 | S | S | S | B | B | S | S | S | S | B | B |
| Example 38 | S | S | S | B | B | S | S | S | S | B | B |
| Example 39 | S | S | S | C | C | S | S | S | S | C | C |
| Example 40 | S | S | S | D | C | S | S | S | S | D | C |
| Example 41 | S | S | S | C | B | S | S | S | S | C | B |
| Comparative Example 9 | S | S | S | E | B | S | S | S | S | E | B |
| Example 42 | S | C | S | S | B | S | S | S | C | S | B |
| Example 43 | S | C | S | S | B | S | S | S | C | S | B |
| Example 44 | S | D | S | S | B | S | S | S | D | S | B |
| Comparative Example 10 | S | E | S | S | B | S | S | S | E | S | B |
| Example 45 | S | S | S | S | B | S | S | S | S | S | B |
| Example 46 | S | S | C | A | B | C | S | S | S | A | B |
| Example 47 | S | S | C | A | B | C | S | S | S | A | B |
| Example 48 | S | S | C | B | B | C | S | S | S | B | B |
| Example 49 | S | S | C | C | B | C | S | S | S | C | B |
| Example 50 | B | S | C | S | B | C | S | B | S | S | B |
| Example 51 | D | S | D | S | B | D | S | D | S | S | B |
| Comparative Example 11 | D | S | E | S | B | E | S | D | S | S | B |
| Example 52 | S | C | S | S | B | S | S | S | C | S | B |
| Example 53 | S | C | S | S | B | S | S | S | C | S | B |
| Example 54 | S | D | S | S | B | S | S | S | D | S | B |
| Comparative Example 12 | S | E | S | S | B | S | S | S | E | S | B |
| Example 55 | S | S | S | S | B | S | S | S | S | S | B |
| Example 56 | D | S | S | S | A | S | B | D | S | S | A |

TABLE 2-1-continued

|  | Film property | | | | | Back sheet property | | | | | |
| --- | --- | --- | --- | --- | --- | --- | --- | --- | --- | --- | --- |
|  | Moist-heat resistance | Flame retardancy | Curling resistance | Ultraviolet light resistance | Light-reflecting property | Flatness | Adehesion | Moist-heat resistance | Flame retardancy | Ultraviolet light resistance | Light-reflecting property |
| Example 57 | D | S | S | S | A | S | D | D | S | S | A |
| Example 58 | D | S | S | S | A | S | E | D | S | S | A |
| Example 59 | S | S | S | C | B | S | S | S | S | C | B |
| Comparative Example 13 | S | S | S | E | B | S | S | S | S | E | B |
| Example 60 | S | C | S | S | B | S | S | S | C | S | B |
| Example 61 | S | C | S | S | B | S | S | S | C | S | B |
| Example 62 | S | D | S | S | B | S | S | S | D | S | B |
| Comparative Example 14 | S | E | S | S | B | S | S | S | E | S | B |
| Example 63 | S | S | S | S | A | S | S | S | S | S | A |
| Example 64 | C | S | S | S | A | S | B | C | S | S | A |
| Example 65 | D | S | S | S | A | S | D | D | S | S | A |
| Example 66 | D | S | S | S | A | S | E | D | S | S | A |
| Example 67 | A | S | C | S | A | C | S | A | S | S | A |
| Comparative Example 15 | B | S | E | S | A | E | S | B | S | S | A |
| Example 68 | S | C | S | S | A | S | S | S | C | S | A |
| Example 69 | S | C | S | S | A | S | S | S | C | S | A |
| Example 70 | S | D | S | S | A | S | S | S | D | S | A |
| Comparative Example 16 | S | E | S | S | A | S | S | S | E | S | A |
| Comparative Example 17 | S | S | S | E | B | S | S | S | S | E | B |
| Comparative Example 18 | S | S | S | E | A | S | S | S | S | E | A |
| Example 71 | S | S | S | S | B | S | S | S | S | S | B |
| Example 72 | S | S | S | S | B | S | S | S | S | S | B |
| Example 73 | C | S | S | S | B | S | S | C | S | S | B |
| Example 74 | S | S | S | S | B | S | S | S | S | S | B |
| Example 75 | S | C | S | S | B | S | S | S | C | S | B |
| Example 76 | S | S | B | S | B | B | S | S | S | S | B |
| Example 77 | S | S | S | S | B | S | S | S | S | S | B |
| Example 78 | S | S | S | S | B | S | S | S | S | S | B |
| Example 79 | S | S | S | S | B | S | S | S | S | S | B |
| Example 80 | S | S | S | C | B | S | S | S | S | C | B |
| Example 81 | C | S | S | S | B | S | S | C | S | S | B |
| Example 82 | S | A | S | B | S | S | S | S | A | B | S |
| Example 83 | S | S | S | S | B | S | E | S | S | S | B |
| Example 84 | A | S | S | S | B | S | S | A | S | S | B |
| Example 85 | C | S | S | S | B | S | S | C | S | S | B |

INDUSTRIAL APPLICABILITY

The polyester film is a polyester film which highly satisfactorily combine high moisture-heat resistance, flame retardancy, and other properties (in particular, ultraviolet light resistance, light-reflecting properties, etc.) over a long period, and it can be suitably used for applications including solar-cell back sheets, sheet heating elements or electrical insulation materials such as a flat cable, capacitor materials, automobile materials and building material, which make use of its characteristics.

The invention claimed is:

1. A polyester film having a laminate structure comprising a polyester layer (layer P1) containing a crystalline polyester and inorganic particles and a polyester layer (layer P2) containing a crystalline polyester, inorganic particles, and an antihydrolysis segment, wherein content Wa2 of the inorganic particles in the layer P2 is at least 10 mass % of the layer P2, a difference between content Wa2 (mass %) of the inorganic particles in the layer P2 and content Wa1 (mass %) of the inorganic particles in the layer P1, Wa2-Wa1, is 5 to 25 mass %, content Wb2 of the antihydrolysis segment in the layer P2 is 0.02 to 1.5 mass % of the layer P2, and a ratio T1/T2 between layer thickness T1 (μm) of the layer P1 and layer thickness T2 (μm) of the layer P2 is 2 to 15.

2. A polyester film having a laminate structure comprising a polyester layer (layer P1) containing a crystalline polyester and inorganic particles and a polyester layer (layer P2) containing, a crystalline polyester, inorganic particles, and an antihydrolysis segment, wherein content Wa2 of the inorganic particles in the layer P2 is at least 10 mass % of the layer P2, a difference between content Wa2 (mass %) of the inorganic particles in the layer P2 and content Wa1 (mass %) of the inorganic particles in the layer P1, Wa2-Wa1, is 5 to 25 mass %, content Wb2 of the antihydrolysis segment in the layer P2 is 0.02 to 1.5 mass % of the layer P2, the content Wa1 of the inorganic particles in the layer P1 is 0.1 to 5 mass % of the layer P1, and a ratio T1/T2 between layer thickness T1 (μm) of the layer P1 and layer thickness T2 (μm) of the layer P2 is 2 to 15.

3. A polyester film having a laminate structure comprising a polyester layer (layer P1) containing a crystalline polyester and inorganic particles and a polyester layer (layer P2) containing a crystalline polyester, inorganic particles, and an antihydrolysis segment, wherein content Wa2 of the inorganic particles in the layer P2 is at least 10 mass % of the layer P2, a difference between content Wa2 (mass %) of the inorganic particles in the layer P2 and content Wa1 (mass %) of the inorganic particles in the layer P1, Wa2-Wa1, is 5 to 25 mass%, content Wb2 of the antihydrolysis segment in the layer P2 is 0.02 to 1.5 mass % of the layer P2, or the layer P1 further contains an antihydrolysis segment and the content Wb1 of the antihydrolysis segment in the layer P1 is 0.01 to 1 mass % of the layer P1, or a ratio T1/T2 between layer thickness T1 (μm) of the layer P1 and layer thickness T2 (μm) of the layer P2 is 2 to 15.

* * * * *